(12) United States Patent
Tu et al.

(10) Patent No.: US 10,819,051 B2
(45) Date of Patent: Oct. 27, 2020

(54) ELECTRICAL CONNECTOR AND ELECTRICAL CONNECTOR ASSEMBLY

(71) Applicant: LOTES CO., LTD, Keelung (TW)

(72) Inventors: Yang Yang Tu, Keelung (TW); Tong Dao Xu, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/446,847

(22) Filed: Jun. 20, 2019

(65) Prior Publication Data
US 2020/0021048 A1    Jan. 16, 2020

(30) Foreign Application Priority Data

Jul. 10, 2018  (CN) .......................... 2018 1 0748812
Dec. 24, 2018  (CN) .......................... 2018 1 1581333

(51) Int. Cl.
| | | |
|---|---|---|
| H01R 12/70 | (2011.01) | |
| H01R 4/02 | (2006.01) | |
| H01R 12/57 | (2011.01) | |
| H01R 12/71 | (2011.01) | |
| H01R 13/11 | (2006.01) | |

(52) U.S. Cl.
CPC ........... *H01R 12/707* (2013.01); *H01R 4/028* (2013.01); *H01R 12/57* (2013.01); *H01R 12/716* (2013.01); *H01R 13/111* (2013.01); *H01R 13/112* (2013.01); *H01R 12/7076* (2013.01)

(58) Field of Classification Search
CPC .... H01R 12/707; H01R 12/57; H01R 12/716; H01R 12/7076; H01R 4/028; H01R 13/111; H01R 13/112

USPC .......................................................... 439/682
See application file for complete search history.

(56) References Cited

U.S. PATENT DOCUMENTS

| | | | | |
|---|---|---|---|---|
| 6,471,534 B1* | 10/2002 | Lee | ....................... | H01R 13/193 439/342 |
| 6,755,667 B2* | 6/2004 | Lin | ......................... | H01R 12/57 439/83 |
| 6,824,414 B2* | 11/2004 | Whyne | ................. | H01R 13/193 439/342 |

(Continued)

FOREIGN PATENT DOCUMENTS

| | | |
|---|---|---|
| CN | 2521756 Y | 11/2002 |
| CN | 1917292 A | 2/2007 |

(Continued)

*Primary Examiner* — Peter G Leigh
(74) *Attorney, Agent, or Firm* — Locke Lord LLP; Tim Tingkang Xia, Esq.

(57) ABSTRACT

An electrical connector includes a body and a plurality of terminals correspondingly provided on the body. Each terminal includes a base, two embracing arms formed by bending and extending forward from two opposite sides of the base, and a stopping portion formed by extending upward from one of the embracing arms. The two embracing arms jointly clamp a solder to solder the terminal to a circuit board, and the stopping portion is located above the solder to stop the solder from moving upward. The embracing arms clamp the solder, and the stopping portion extends from the embracing arms to stop the solder from moving upward, such that the solder can be well positioned. When the solder is soldered and melted, the embracing arms drive the stopping portion to shrink, such that the embracing arms and the stopping portion jointly squeeze the solder.

20 Claims, 29 Drawing Sheets

(56) References Cited

U.S. PATENT DOCUMENTS

| | | | | |
|---|---|---|---|---|
| 7,303,421 B2 * | 12/2007 | Liao | H01R 4/02 | 439/342 |
| 7,484,985 B2 * | 2/2009 | Wang | H01R 12/57 | 439/342 |
| 7,563,105 B2 * | 7/2009 | Liu | H01R 13/2492 | 439/66 |
| 7,682,165 B2 * | 3/2010 | Liao | H05K 3/3426 | 439/342 |
| 7,717,760 B2 * | 5/2010 | Ma | H01R 12/89 | 439/135 |
| 7,938,649 B2 * | 5/2011 | Gattuso | H01R 13/115 | 439/71 |
| 8,016,623 B2 * | 9/2011 | Ju | H01R 13/112 | 439/342 |
| 8,047,864 B1 * | 11/2011 | Ju | H01R 4/58 | 439/342 |
| 8,052,436 B1 * | 11/2011 | Ju | H01R 12/57 | 439/342 |
| 8,100,700 B2 * | 1/2012 | Chen | H01R 4/02 | 439/66 |
| 8,192,206 B1 * | 6/2012 | Ju | H01R 12/57 | 439/66 |
| 8,215,998 B1 * | 7/2012 | Ju | H01R 12/7076 | 439/626 |
| 8,277,230 B2 * | 10/2012 | Huo | H01R 12/716 | 439/342 |
| 8,360,790 B2 * | 1/2013 | Ju | H01R 12/716 | 439/66 |
| 8,414,311 B2 * | 4/2013 | Ju | H01R 12/89 | 439/83 |
| 8,608,491 B2 * | 12/2013 | Hsu | H01R 13/24 | 439/66 |
| 8,708,716 B1 * | 4/2014 | Ho | H01R 12/714 | 439/83 |
| 9,806,444 B1 * | 10/2017 | Ju | H01R 12/585 | |
| 9,954,312 B1 * | 4/2018 | Ju | H01R 12/707 | |
| 2006/0094268 A1 * | 5/2006 | Hao | H01R 12/57 | 439/83 |
| 2006/0258191 A1 * | 11/2006 | Chen | H05K 3/3426 | 439/83 |
| 2007/0249240 A1 * | 10/2007 | Chiang | H05K 3/3426 | 439/850 |
| 2008/0160820 A1 * | 7/2008 | Deng | H01R 12/57 | 439/358 |
| 2018/0331442 A1 * | 11/2018 | Huang | H01R 12/714 | |

FOREIGN PATENT DOCUMENTS

| | | |
|---|---|---|
| CN | 201570752 U | 9/2010 |
| CN | 201937059 U | 8/2011 |
| CN | 203859268 U | 10/2014 |
| CN | 107565237 A | 1/2018 |

* cited by examiner

G-G

I-I

ELECTRICAL CONNECTOR AND ELECTRICAL CONNECTOR ASSEMBLY

CROSS-REFERENCE TO RELATED PATENT APPLICATION

This non-provisional application claims priority to and the benefit of, pursuant to 35 U.S.C. § 119(a), patent application Serial No. CN201810748812.2 filed in China on Jul. 10, 2018, and patent application Serial No. CN201811581333.2 filed in China on Dec. 24, 2018. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector and an electrical connector assembly, and more particularly to an electrical connector and an electrical connector assembly having a small insertion force.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, an electrical connector frequently used in the industry includes an insulating body provided with multiple accommodating holes. Each accommodating hole has two first side walls opposite to each other, and a second side wall and a third side wall opposite to each other and connecting the two first side walls. A protruding block protrudes from the second side wall toward the third side wall, and the protruding block is separated from both the two first side walls and the third side wall. Multiple terminals are correspondingly accommodated in the accommodating holes. Each terminal includes a plate portion, and two embracing arms formed by bending and extending from two opposite sides of the plate portion along a horizontal direction. The two embracing arms are configured to clamp a solder to solder the terminal to a circuit board, and the protruding block is located above the solder to limit the solder from moving upward.

However, when the electrical connector is reflow soldered in a reflow oven, the insulation body is easily warped due to heating, such that the protruding block is deformed and loses the positioning function to the solder, which results in that the solder is easily moving upward excessively and even falling off, thereby affecting a soldering effect of the solder, and even causing missing soldering or open soldering.

Therefore, a heretofore unaddressed need to design a new electrical connector exists in the art to address the aforementioned deficiencies and inadequacies.

SUMMARY

An objective of the present invention is to provide an electrical connector and an electrical connector assembly that reliably position a solder and ensure a soldering effect.

To achieve the foregoing objective, the present invention adopts the following technical solutions:

An electrical connector includes: a body; and a plurality of terminals, correspondingly provided on the body, wherein each of the terminals comprises a base, two embracing arms formed by bending and extending forward from two opposite sides of the base, and a stopping portion formed by extending upward from one of the embracing arms, the two embracing arms jointly clamp a solder to solder the terminal to a circuit board, and the stopping portion is located above the solder to stop the solder from moving upward.

In certain embodiments, the two embracing arms and the stopping portion jointly clamp the solder.

In certain embodiments, a contact position of the stopping portion and the solder is lower than a highest point of the solder.

In certain embodiments, two stopping portions are respectively provided on the two embracing arms, and the two stopping portions bend and extend upward toward each other.

In certain embodiments, a position stopping portion is formed by extending upward from the one of the embracing arms to match with the body to limit the one of the embracing arms from moving upward, and the stopping portion is located behind the position stopping portion.

In certain embodiments, the position stopping portion vertically extends upward from a front end of the one of the embracing arms, and an upper end of the position stopping portion is higher than an upper end of the stopping portion.

In certain embodiments, each of the embracing arms comprises a first section connecting the base and the stopping portion and a second section connecting a front end of the embracing arm and the stopping portion, and a length of the first section is greater than a length of the second section.

In certain embodiments, two protruding portions are formed by extending from a left side and a right side of the base to fix and match with the body, and an upper end of the stopping portion is higher than a lower end of each of the protruding portions.

In certain embodiments, the base of each of the terminals comprises a fixing portion fixed to the body, a connecting portion formed by bending and extending from a side of the fixing portion, and an extending portion formed by bending and extending from a side of the connecting portion, each of the terminals comprises two clamping arms configured to jointly clamp a pin of a plug, one of the two clamping arms is formed by extending upward from the fixing portion, and the other of the two clamping arms is formed by extending upward from the extending portion.

In certain embodiments, each of the terminals comprises two extending arms formed by extending forward and upward from two opposite sides of the base, two elastic arms formed by extending upward from upper ends of the two extending arms, two clamping portions formed by extending backward from rear sides of the two elastic arms, and two guiding portions formed by extending upward from the two clamping portions, the two guiding portions are configured to guide a pin of a plug to be inserted downward, and the two clamping portions are configured to jointly clamp the pin.

An electrical connector assembly includes: a plug, comprising a base seat and a plurality of pins positioned on the base seat and extends downward out of the base seat; and a socket, comprising: a body; and a plurality of terminals provided on the body, wherein each of the terminals comprises a base provided on the body, two clamping arms and two embracing arms formed by extending from the base, and a stopping portion formed by extending upward from one of the embracing arms, the two clamping arms jointly clamp a corresponding pin of the pins, the two embracing arms jointly clamp a solder to solder the terminal to a circuit board, and the stopping portion is located above the solder to stop the solder from moving upward.

In certain embodiments, two stopping portions are respectively provided on the two embracing arms, and the two stopping portions bend and extend upward toward each other.

In certain embodiments, the two embracing arms and the two stopping portions jointly clamp the solder.

In certain embodiments, the base of each of the terminals comprises a fixing portion fixed to the body, a connecting portion formed by bending and extending from a side of the fixing portion, and an extending portion formed by bending and extending from a side of the connecting portion, one of the two clamping arms is formed by extending upward from the fixing portion, and the other of the two clamping arms is formed by extending upward from the extending portion.

In certain embodiments, each of the pins comprises a plate portion, two conducting arms opposite to each other, and a connecting arm that connects the two conducting arms, one of the two conducting arms is formed by extending downward from the plate portion, the two conducting arms extend downward out of the base seat and are inserted into the body, and when the two conducting arms are inserted downward into the body to a final position, the two clamping arms jointly clamp the two conducting arms, and a height of a contact position of the two clamping arms and the two conducting arms is between an upper end and a lower end of the connecting arm.

In certain embodiments, lower ends of the two conducting arms bend and extend downward toward each other, and when the two conducting arms are inserted downward into the body to the final position, the lower ends of the two conducting arms are lower than a lower end of the connecting portion.

In certain embodiments, each of the pins is in a plate shape, and a plate surface of each of the pins is parallel to a plate surface of the fixing portion of a corresponding one of the terminals.

In certain embodiments, the body has a plurality of accommodating holes accommodating the terminals and a separation wall located between two adjacent ones of the accommodating holes, and each of the pins is in a plate shape and is partially located right above the separation wall.

In certain embodiments, each of the pins comprises two clamping portions and a position limiting portion formed by bending and extending downward from one of the clamping portions, the two clamping portions clamp a solder ball to solder a corresponding one of the pins to a substrate, and the position limiting portion is located below the solder ball to stop the solder ball from moving downward.

In certain embodiments, two position limiting portions are respectively provided on the two clamping portions, and the two clamping portions and the two position limiting portions jointly clamp the solder ball.

Compared with the related art, the electrical connector and the electrical connector assembly according to certain embodiments of the present invention have the following beneficial effects:

The embracing arms clamp the solder, and the stopping portion extends from the embracing arms to stop the solder from moving upward, such that the solder can be well positioned. When the solder is soldered and melted, the embracing arms drive the stopping portion to shrink, such that the embracing arms and the stopping portion jointly squeeze the solder, damaging an oxidation layer on a surface of the solder to a greater extent, and enhancing a soldering effect of the solder.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
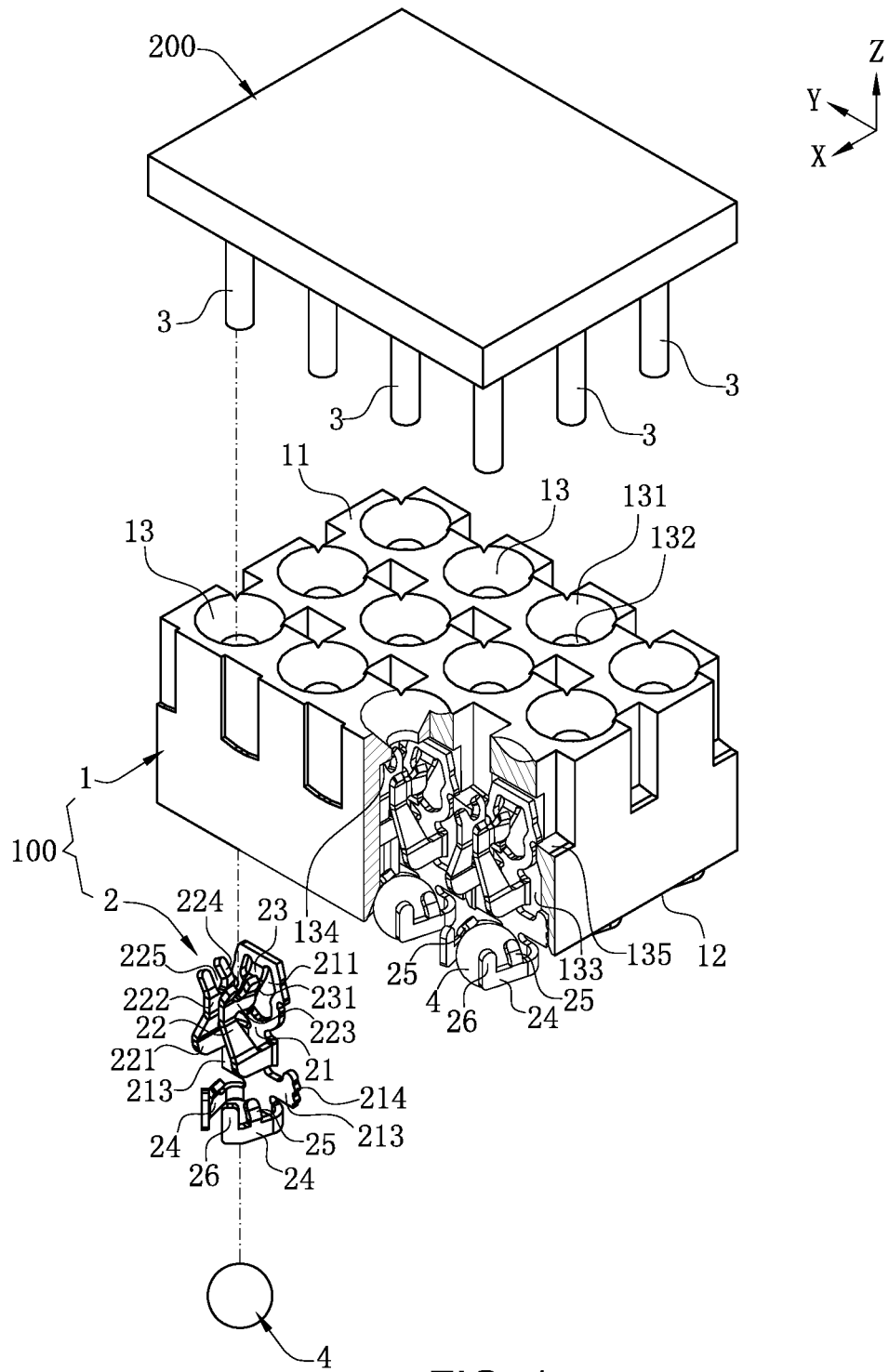
FIG. 1 is a perspective view of an electrical connector assembly according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-29. In accordance with the purposes of this invention, as embodied and broadly described herein, this invention, in one aspect, relates to an electrical connector and an electrical connector assembly.

As shown in FIG. 1, in an electrical connector assembly 10 according to a first embodiment of the present invention, a front-rear direction X as well as a left-right direction Y and a vertical direction Z that are perpendicular to the front-rear direction X are defined.

Figure 8:
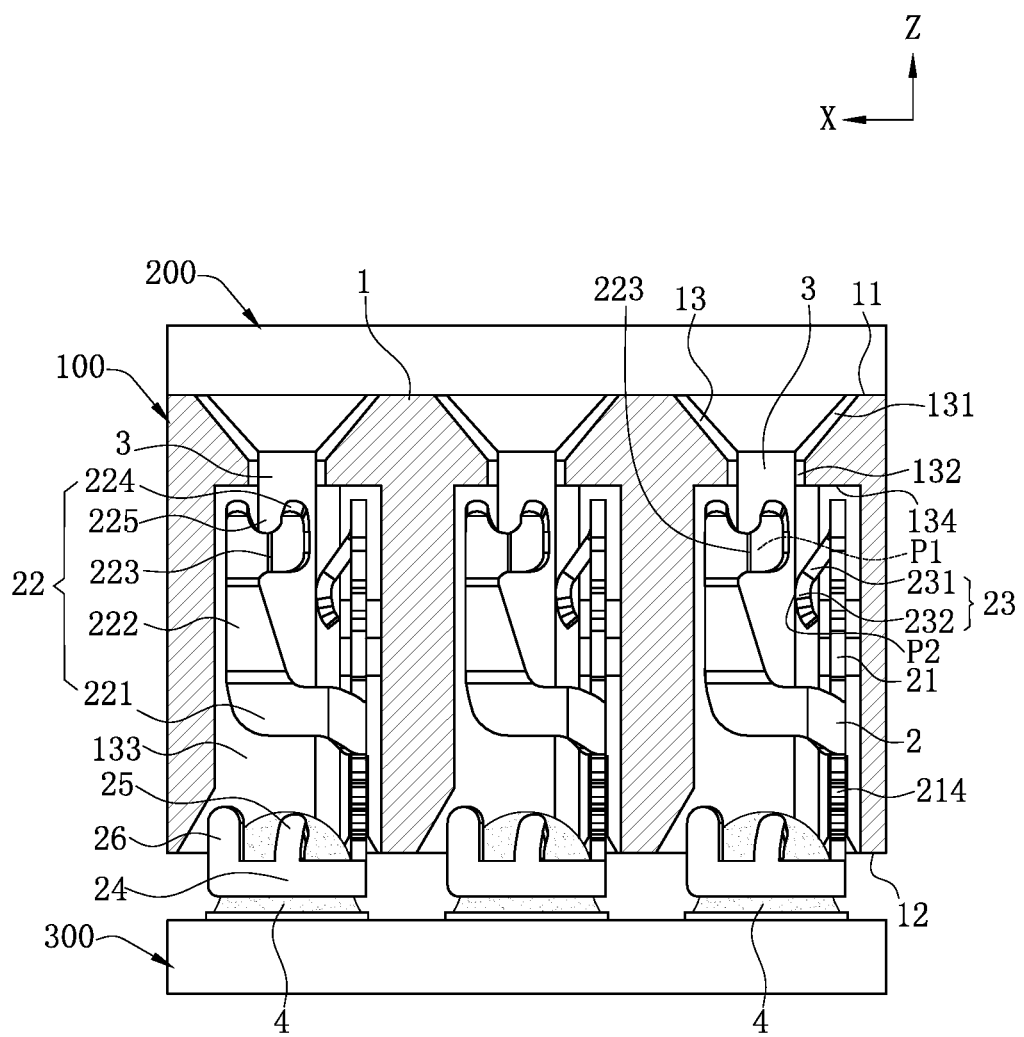
FIG. 8 is a schematic view of the socket and the corresponding plug in FIG. 7 after insertion.

As shown in FIG. 1 and FIG. 8, the electrical connector assembly 10 includes a socket 100 and a plug 200. The socket 100 includes a body 1 supporting the plug 200 upward and a plurality of terminals 2 accommodated in the body 1. The plug 200 is a chip module, and the plug 200 has a plurality of pins 3 correspondingly inserted into the terminals 2.

Figure 7:
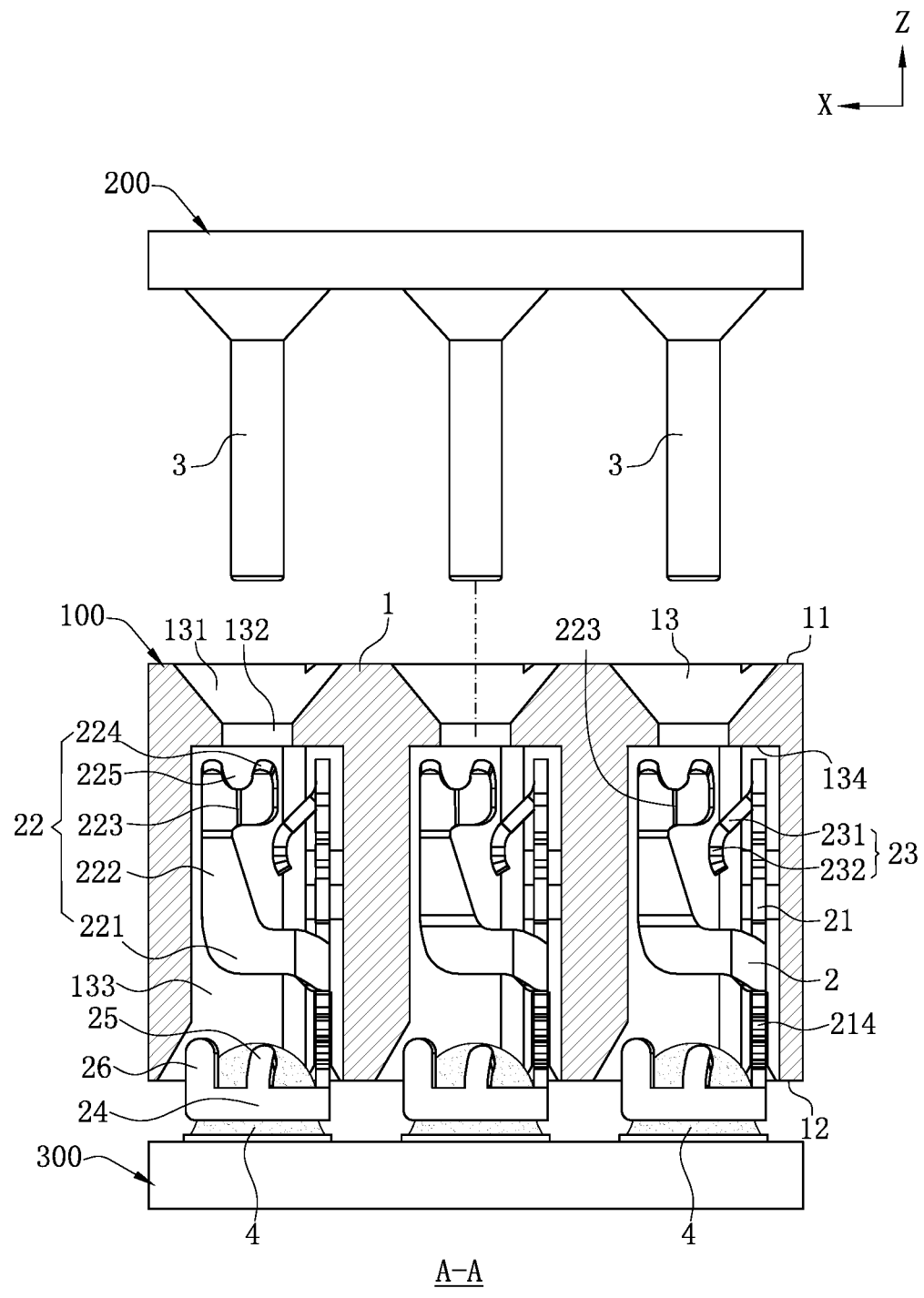
FIG. 7 is a sectional view of the socket in FIG. 6 and a corresponding plug before insertion along the A-A direction.

As shown in FIG. 1 and FIG. 7, the body 1 is an integral structure made of an insulating material. The body 1 has an upper surface 11 and a lower surface 12 opposite to each other, and a plurality of accommodating holes 13 vertically run through the upper surface 11 and the lower surface 12. In other embodiments, the body 1 may include two separate pieces of structure.

As shown in FIG. 1, FIG. 7, and FIG. 8, each accommodating hole 13 includes a guiding hole 131 downward concavely provided from the upper surface 11, a connecting hole 132 extending downward from the guiding hole 131 and configured to accommodate a corresponding one of the pins 3, and a receiving hole 133 extending downward from the connecting hole 132 to run through the lower surface 12 and configured to accommodate a corresponding one of the terminals 2. The guiding hole 131 is in an inverted frustoconical shape and is configured to guide the corresponding pin 3 to move downward. The connecting hole 132 is in a cylindrical shape and has a diameter less than a diameter of the receiving hole 133, such that a blocking wall 134 is formed on an upper wall of the receiving hole 133, and the blocking wall 134 is parallel to the upper surface 11.

Figure 9:
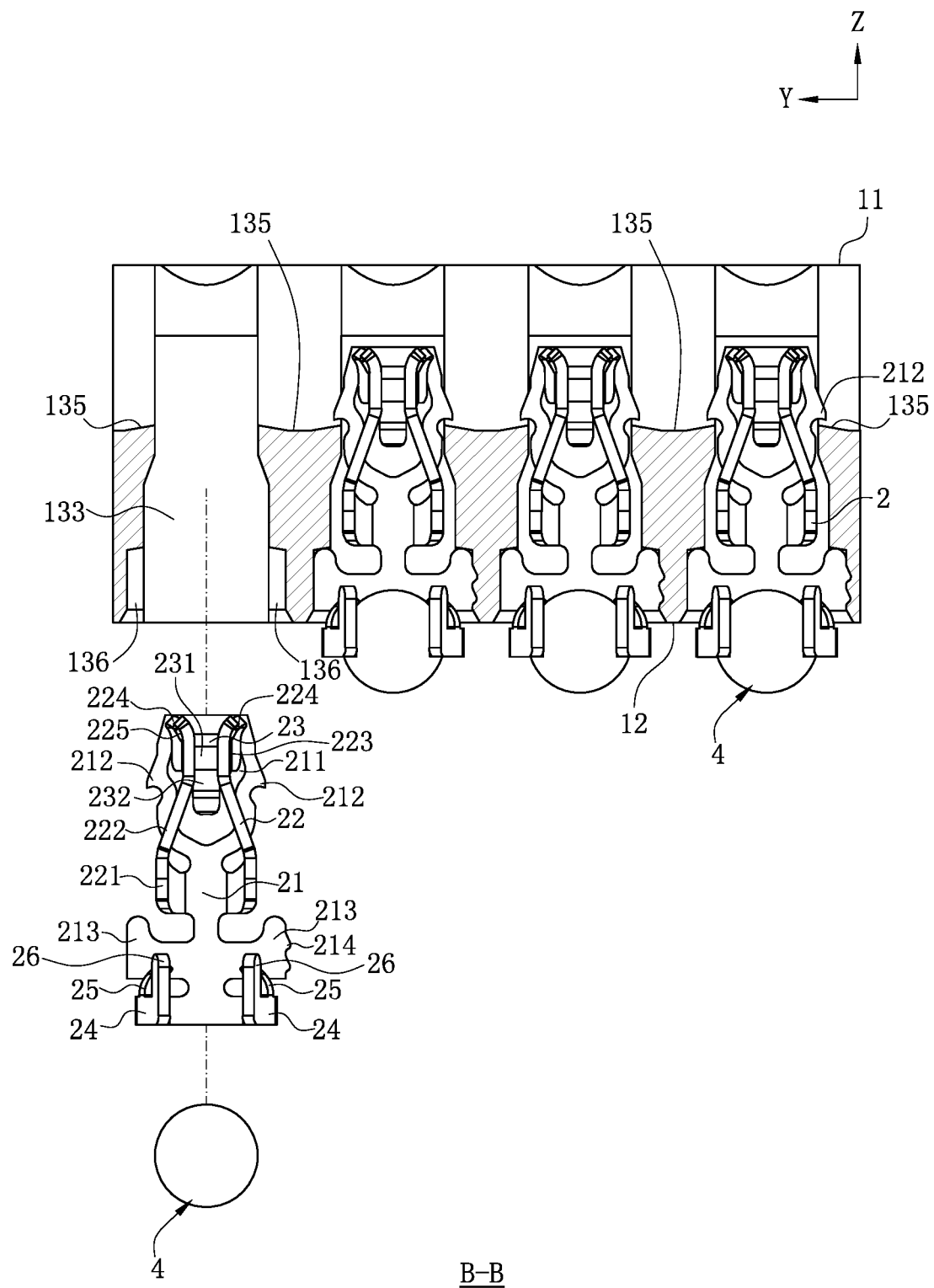
FIG. 9 is a sectional view of the socket in FIG. 6 along the B-B direction.

As shown in FIG. 1 and FIG. 9, each receiving hole 133 further has two position limiting slots 135 running upward through the upper surface 11 and two grooves 136 running downward through the lower surface 12.

As shown in FIG. 1 and FIG. 9, the terminals 2 are correspondingly accommodated in the receiving holes 133.

Figure 2:
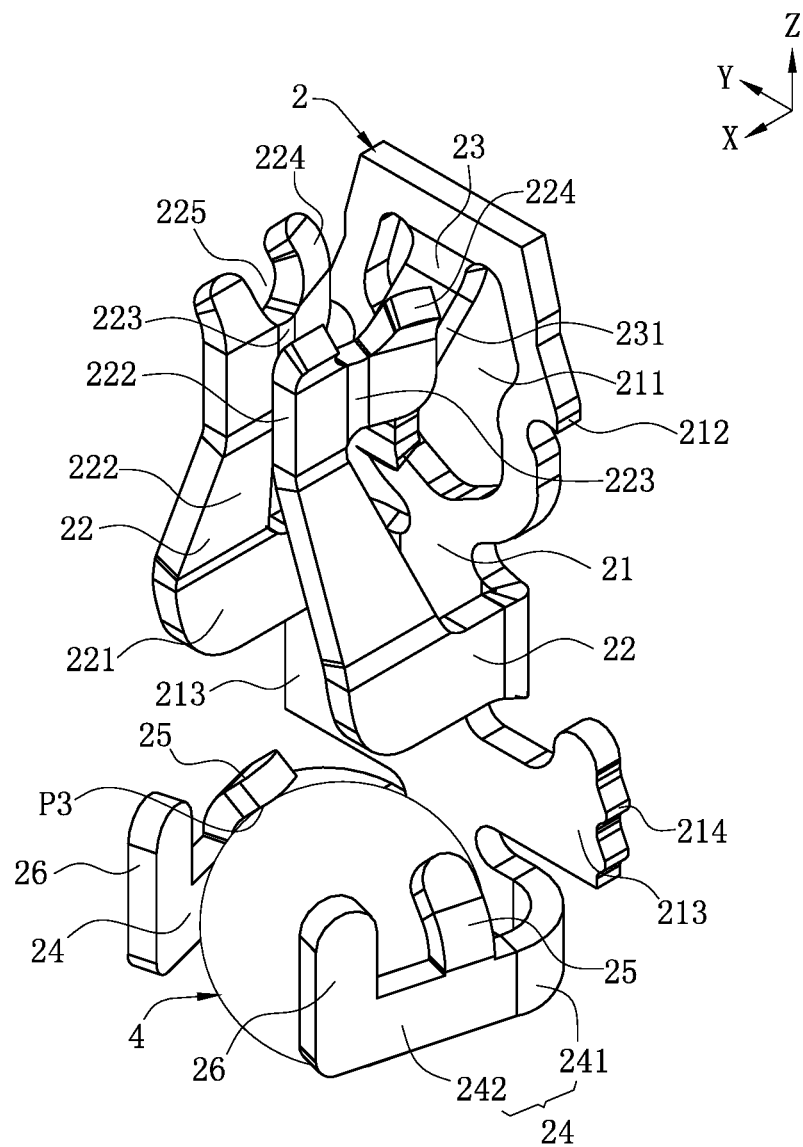
FIG. 2 is a perspective view of a terminal and a solder in FIG. 1 after being assembled.
Figure 3:
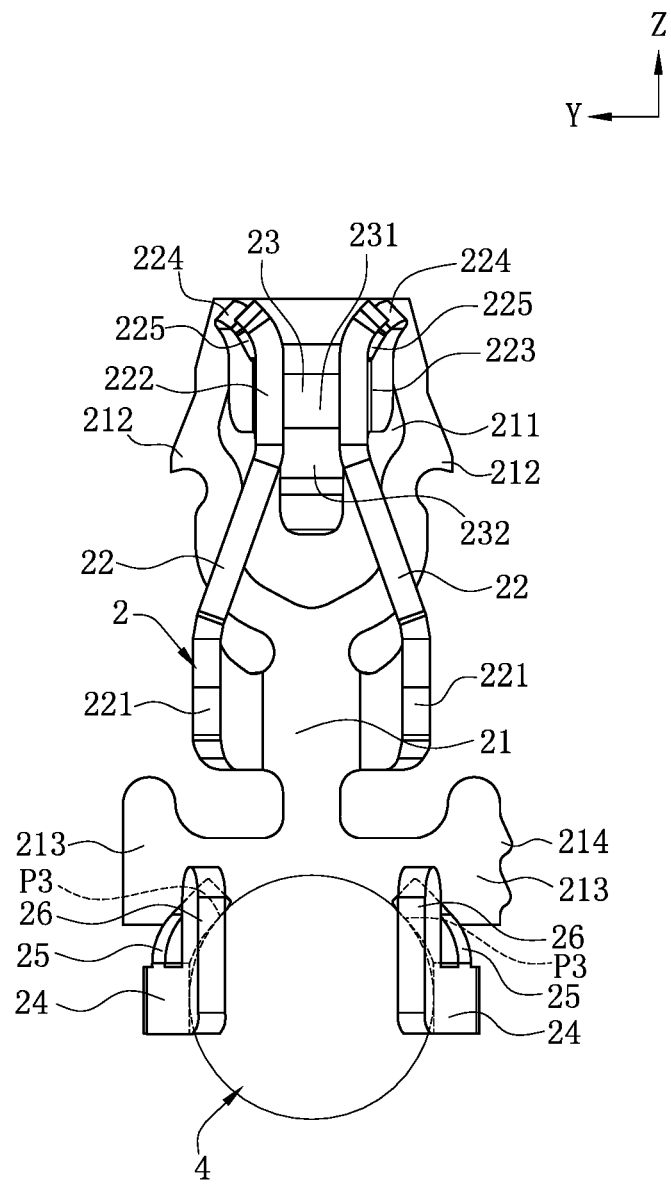
FIG. 3 is a main view of FIG. 2.
Figure 4:
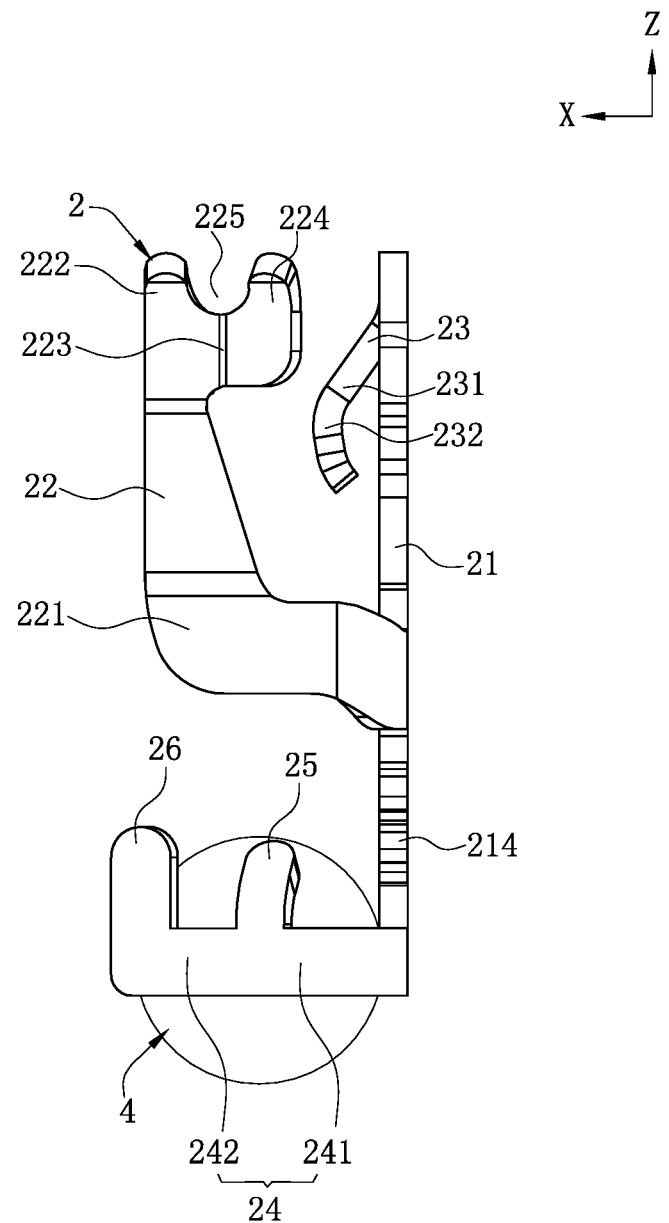
FIG. 4 is a side view of FIG. 2.

As shown in FIG. 2 to FIG. 4, each terminal 2 includes a base 21, two clamping arms 22, a contact arm 23, two embracing arms 24, two stopping portions 25, and two position stopping portions 26.

As shown in FIG. 7, the base 21 is in a vertical plate shape, and an upper end of the base 21 is located right below the blocking wall 134.

As shown in FIG. 2 and FIG. 3, the base 21 has a through hole 211, and two hook portions 212 located at the left and right sides of the through hole 211. Two protruding portions 213 are provided to first extend from the left and right sides of the base 21 along the left-right direction Y, and then extend upward, to increase areas of the protruding portions 213 and to thereby increase strength of the protruding portions 213. As shown in FIG. 9, the hook portions 212 are correspondingly accommodated in the position limiting slots 135, and a bottom surface of each position limiting slot 135 is located right below a corresponding hook portion 212 to limit the terminal 2 from moving downward. As shown in FIG. 9, the protruding portions 213 are accommodated in the grooves 136, and an upper edge of each protruding portion 213 matches with a top surface of a corresponding groove 136 to limit the terminal 2 from moving downward. In this embodiment, a side edge of one of the two protruding portions 213 is a straight line, which matches with a side surface of the corresponding groove 136 to horizontally adjust the location of the terminal 2 in the corresponding accommodating hole 13, such that the terminal 2 is correctly located in the corresponding accommodating hole 13, preventing the terminal 2 from tilting. A side edge of the other protruding portion 213 is provided with a protrusion 214, which is in an interference fit with the other side surface of the corresponding groove 136, such that when a size of the protruding portion 213 is excessively large due to a manufacturing tolerance, the protrusion 214 may penetrate the side surface of the corresponding groove 136 to smoothly assemble the terminal 2 in the accommodating hole 12.

As shown in FIG. 2 to FIG. 4, the two clamping arms 22 are formed by bending forward from the left and right sides of the base 21 and then extending upward. Each clamping arm 22 includes an extending arm 221 bending and extending forward and upward from the base 21 (the extending arm 221 is provided by extending upward from the base 21 to give space to the protruding portions 213 when the protruding portions 213 are formed), an elastic arm 222 extending upward from an upper end of the extending arm 221, a clamping portion 223 extending backward from a rear side of the elastic arm 222, and a first guiding portion 224 extending upward from the clamping portion 223.

The extending arm 221 and the elastic arm 222 are provided in such a structure, increasing a length of the clamping arm 22, and the extending arm 221 and the elastic arm 222 may elastically deform together when being used. Therefore, the terminal 2 may provide a relatively good elastic force, thereby decreasing the loss of the pins 3 of the plug 200.

Figure 6:
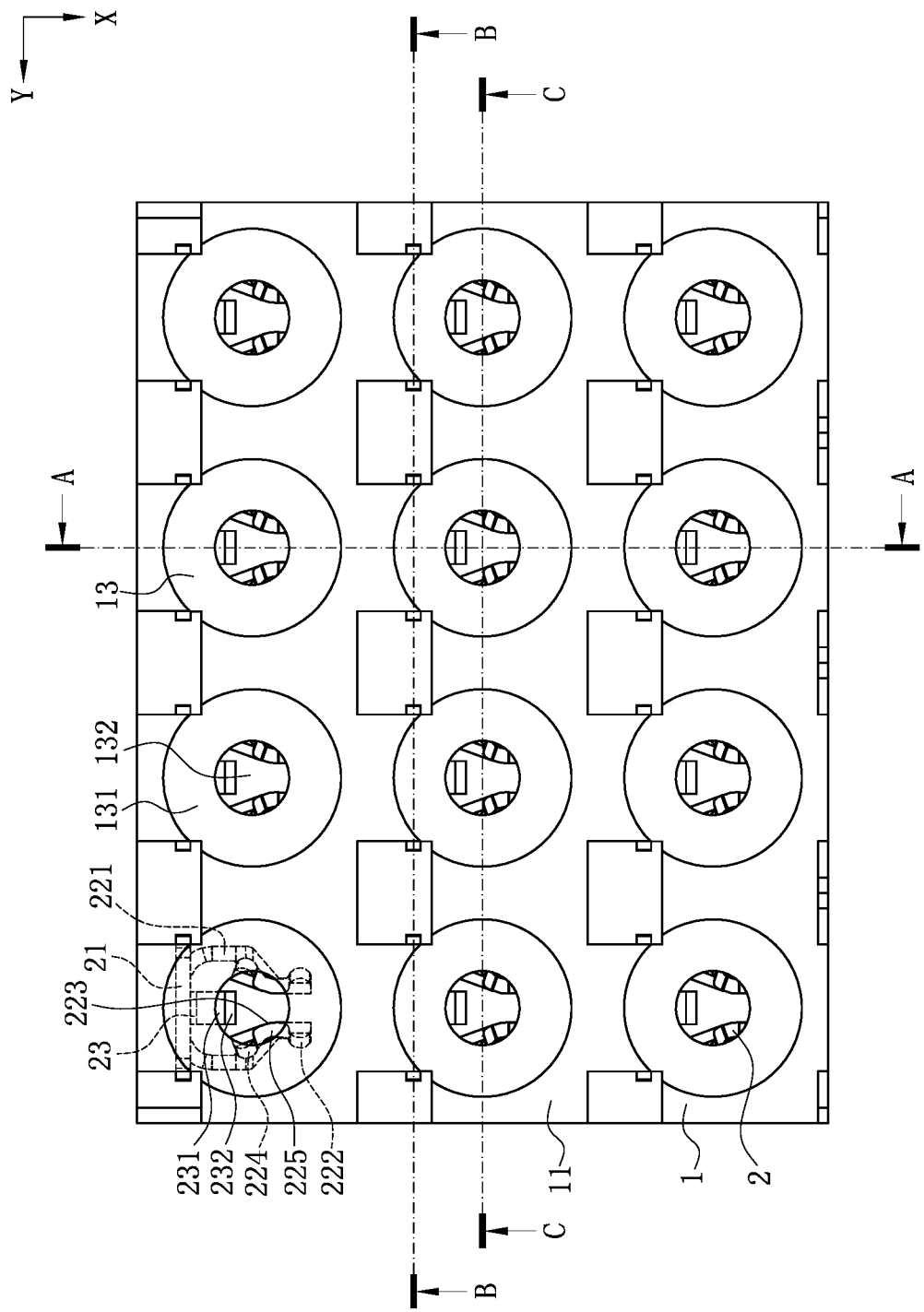
FIG. 6 is a top view of a socket in FIG. 1.
Figure 10:
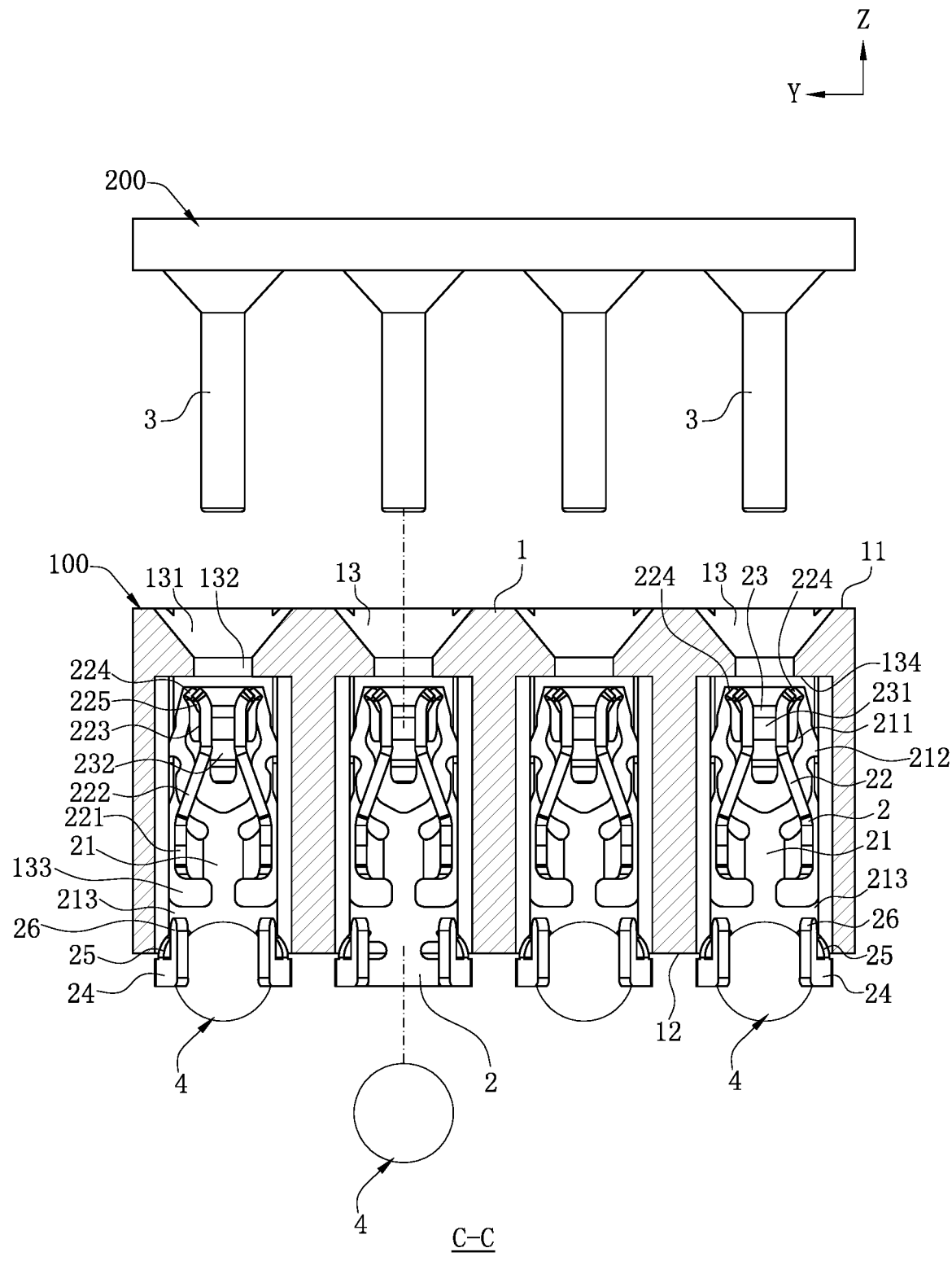
FIG. 10 is a sectional view of the socket in FIG. 6 and a corresponding plug before insertion along the C-C direction.

As shown in FIG. 6 and FIG. 10, an upper end of the elastic arm 222 expands outward and is located right below the blocking wall 134. The clamping portion 223 is located right below the connecting hole 132, and a gap between the two clamping portions 223 gradually becomes larger along a backward direction from the front thereof. The first guiding portion 224 expands outward, and an upper end of the first guiding portion 224 is located right below the blocking wall 134, and the first guiding portion 224 is partially located right below the connecting hole 132.

As shown in FIG. 2 and FIG. 4, the clamping arm 22 further has an opening 225 downward concavely provided on an upper end of the clamping arm 22, and the opening 225 is connected to the rear side of the elastic arm 222, the upper ends of the clamping portions 223, and a front side of the first guiding portion 224 simultaneously. As shown in FIG. 6 and FIG. 7, the opening 225 is partially located right below the connecting hole 132, and a width of each opening 225 is less than a diameter of the lower ends of each pin 3.

As shown in FIG. 2 to FIG. 4, the contact arm 23 includes a second guiding portion 231 bending forward and extending downward from an upper end of the through hole 211, and an abutting portion 232 extending downward from the second guiding portion 231.

As shown in FIG. 6 and FIG. 7, the second guiding portion 231 is partially located right below the connecting hole 132, and the abutting portion 232 is located right below the connecting hole 132. As shown in FIG. 7 and FIG. 8, the second guiding portion 231 is located below the first guiding portion 224, and the second guiding portion 231 and the first guiding portion 224 are configured to guide the corresponding pin 3 to be inserted downward. The abutting portion 232 is located below the clamping portions 223, and the abutting portion 232 and the two clamping portions 223 are configured to jointly clamp the corresponding pin 3 (refer to FIG. 13).

Figure 14:
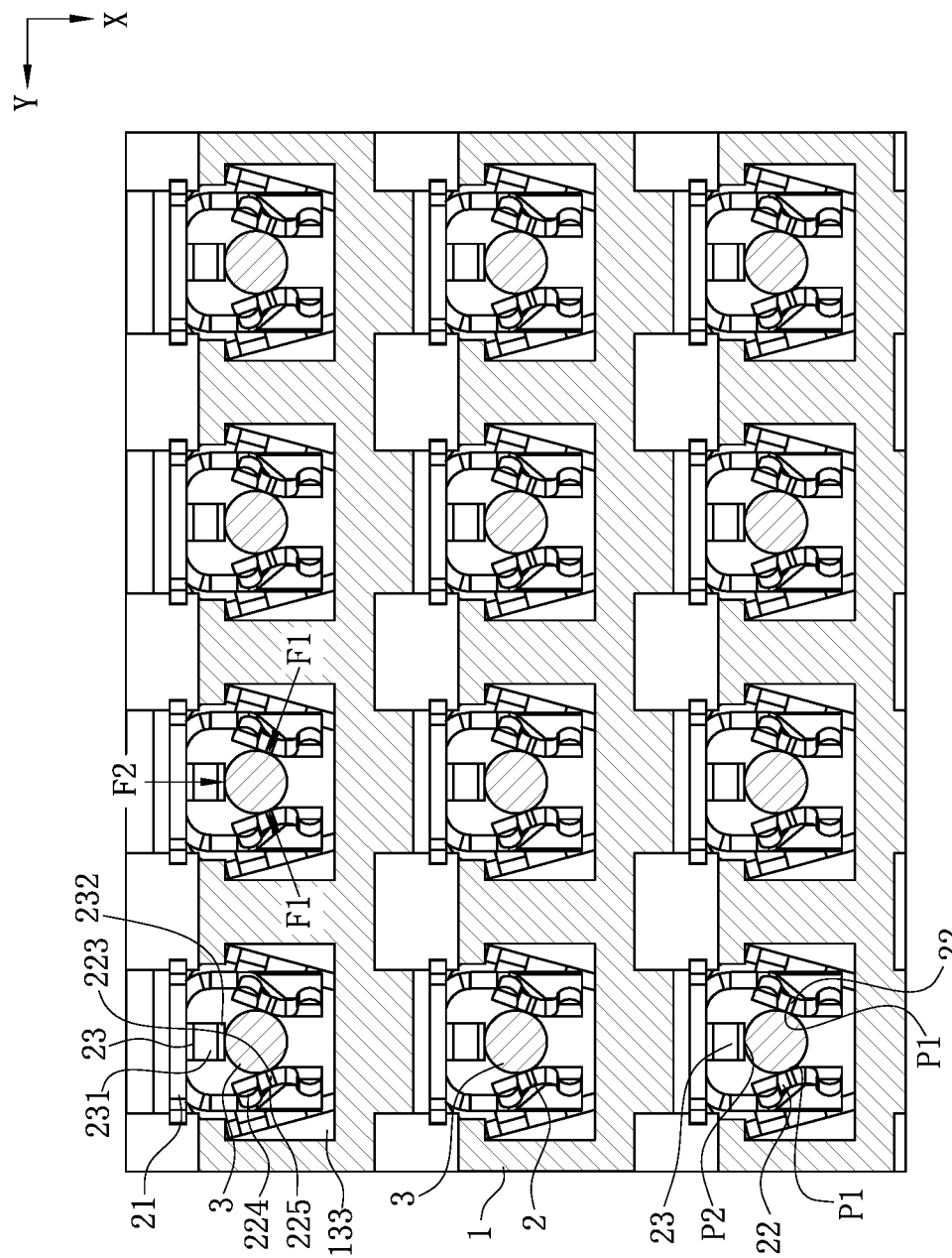
FIG. 14 is a sectional view of the socket and the corresponding plug in FIG. 13 along the E-E direction.
Figure 15:
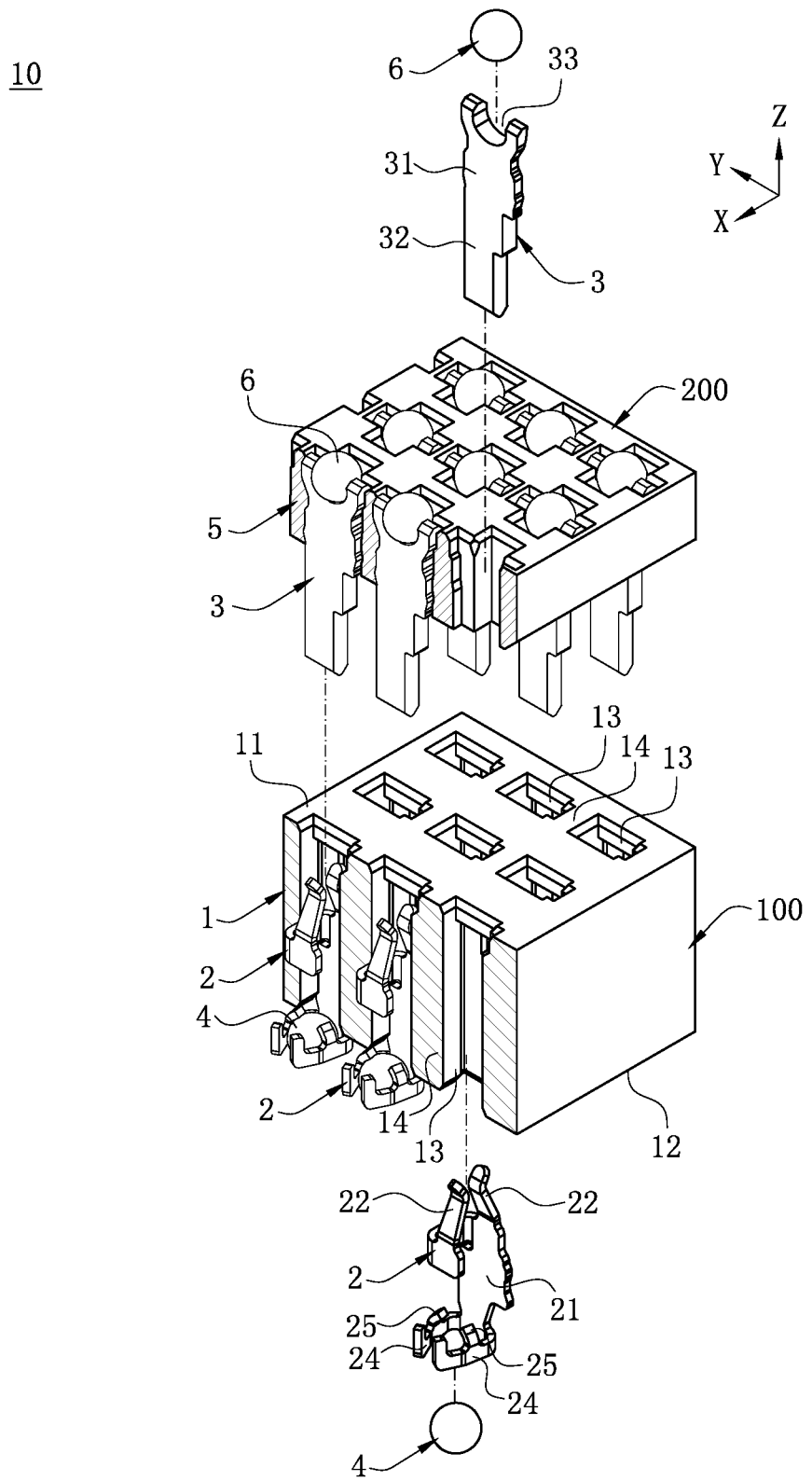
FIG. 15 is a perspective view of an electrical connector assembly according to a second embodiment of the present invention.
Figure 16:
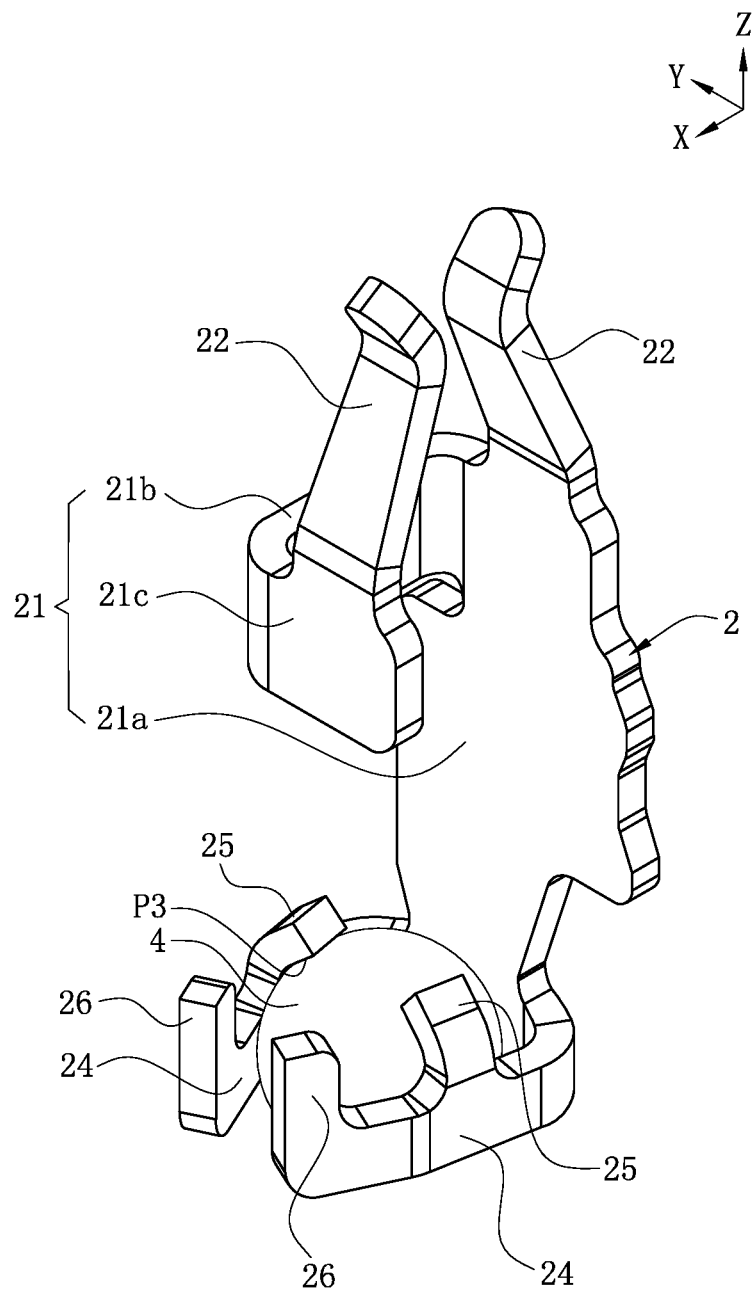
FIG. 16 is a perspective view of a terminal and a solder in FIG. 15 after being assembled.
Figure 17:
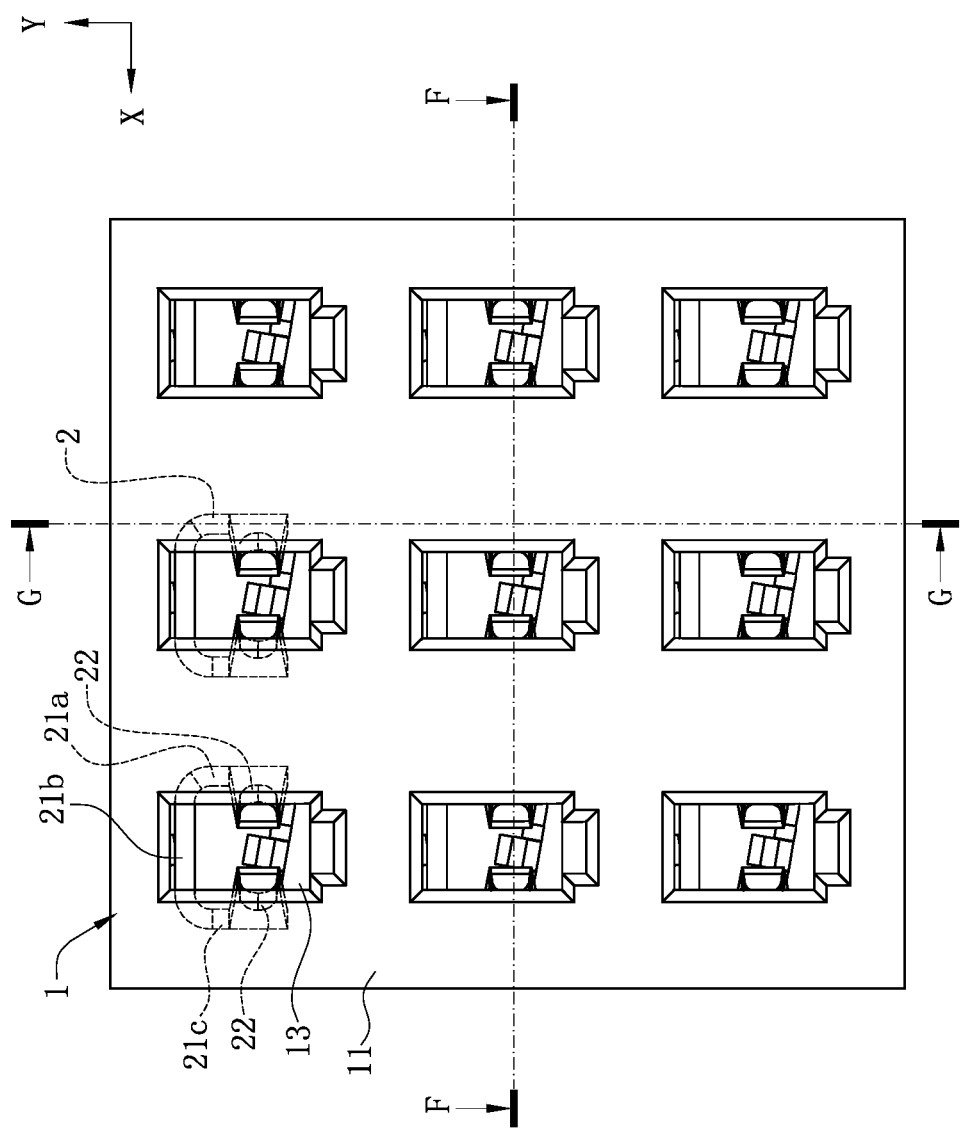
FIG. 17 is a top view of a socket in FIG. 15.
Figure 18:
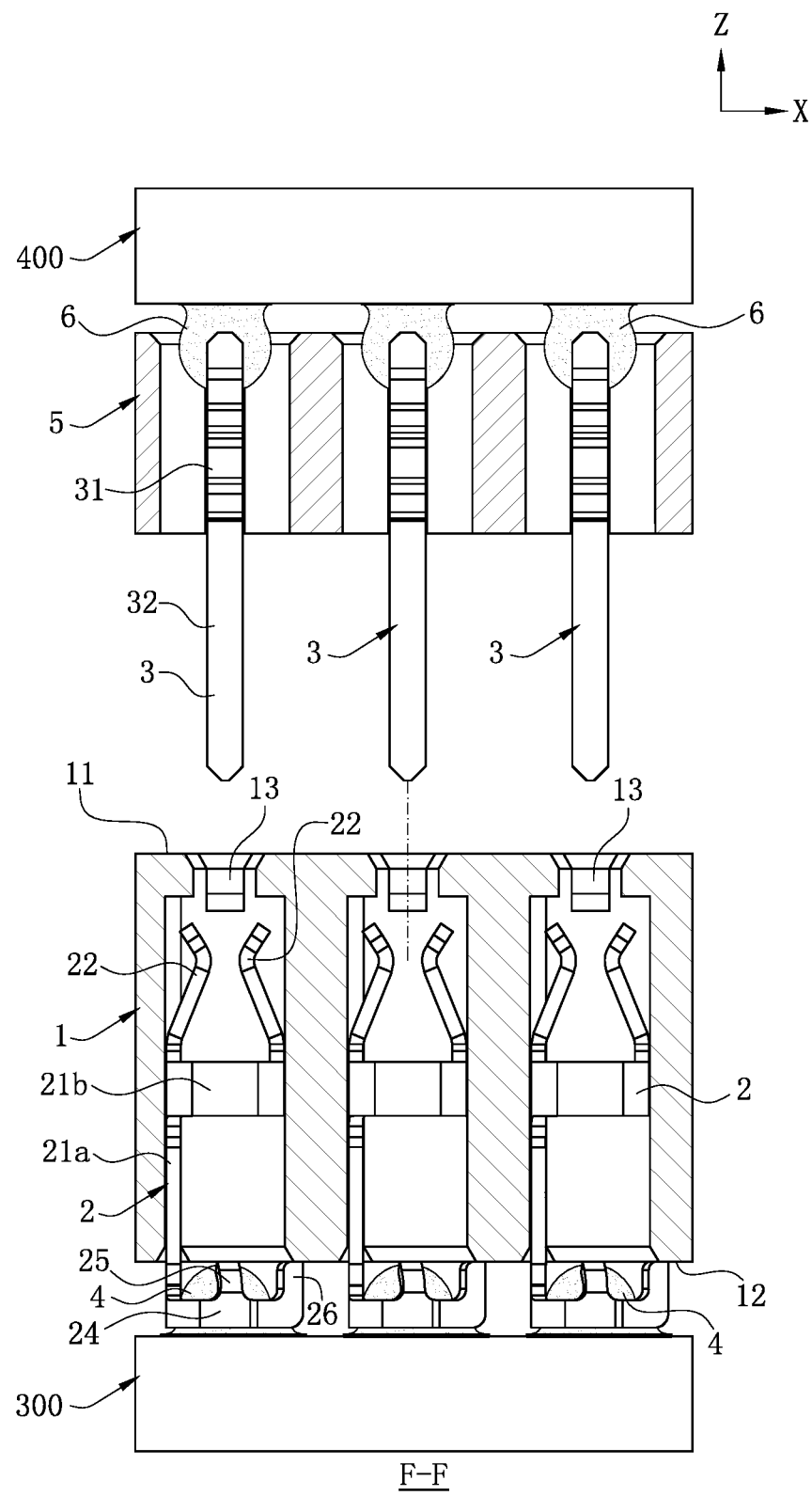
FIG. 18 is a sectional view of the socket in FIG. 17 and a corresponding plug before insertion along the F-F direction.
Figure 19:
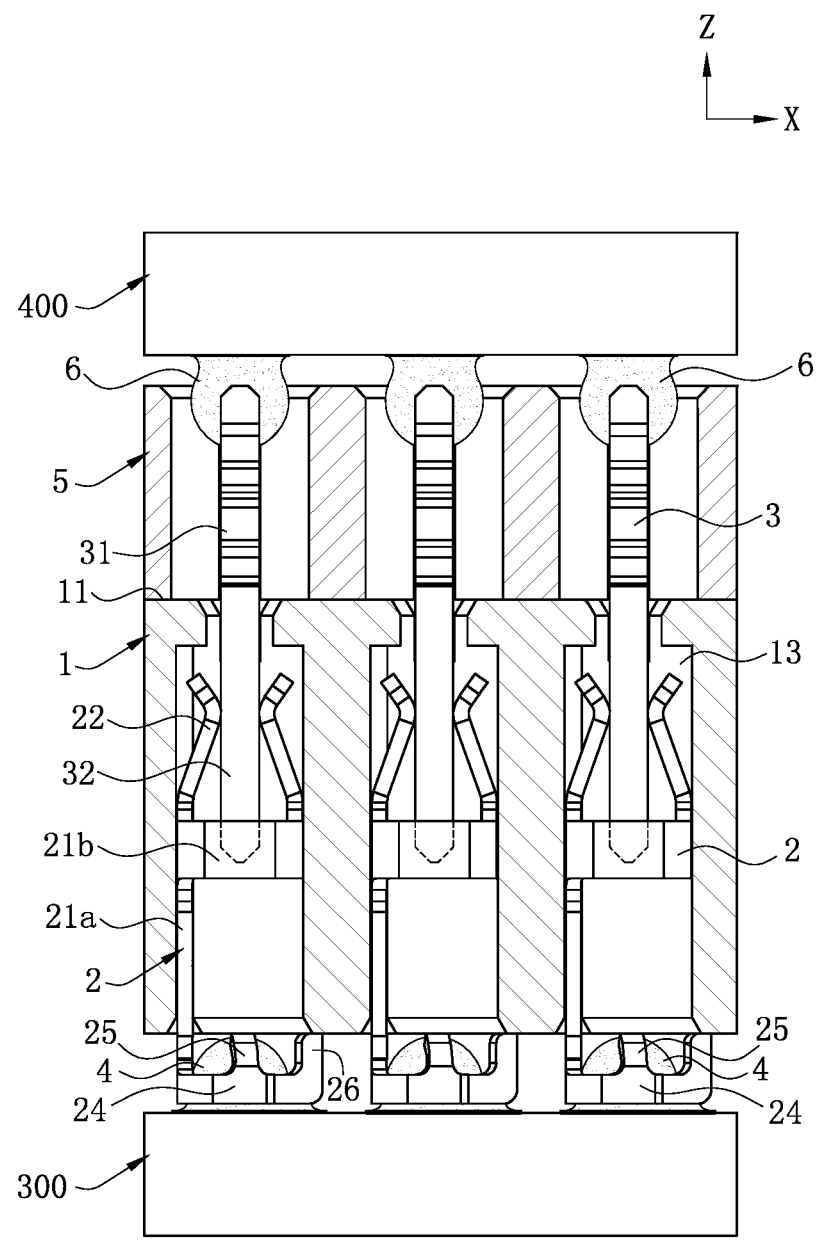
FIG. 19 is a schematic view of the socket and the corresponding plug in FIG. 18 after insertion.
Figure 20:
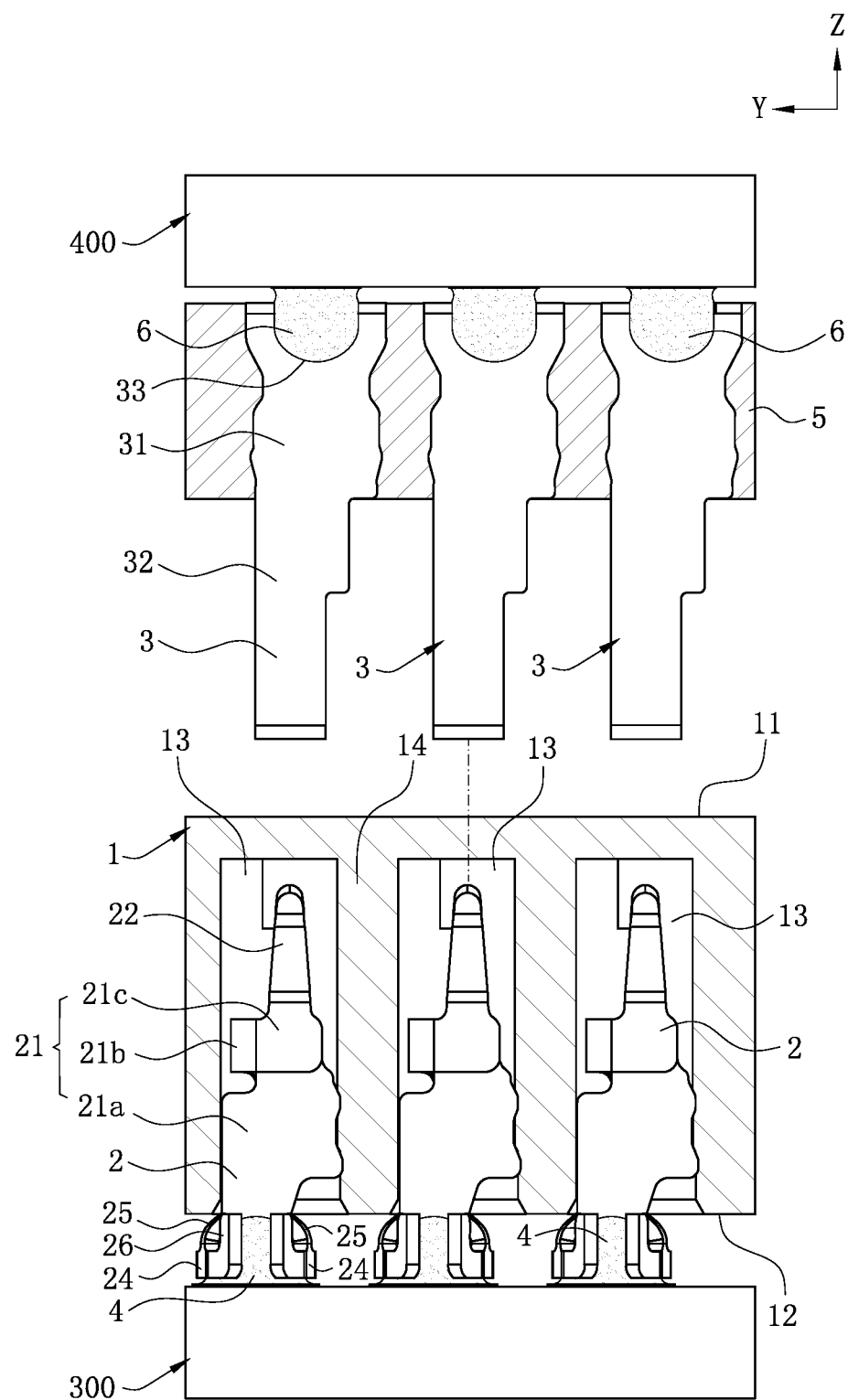
FIG. 20 is a sectional view of the socket in FIG. 17 and a corresponding plug before insertion along the G-G direction.
Figure 21:
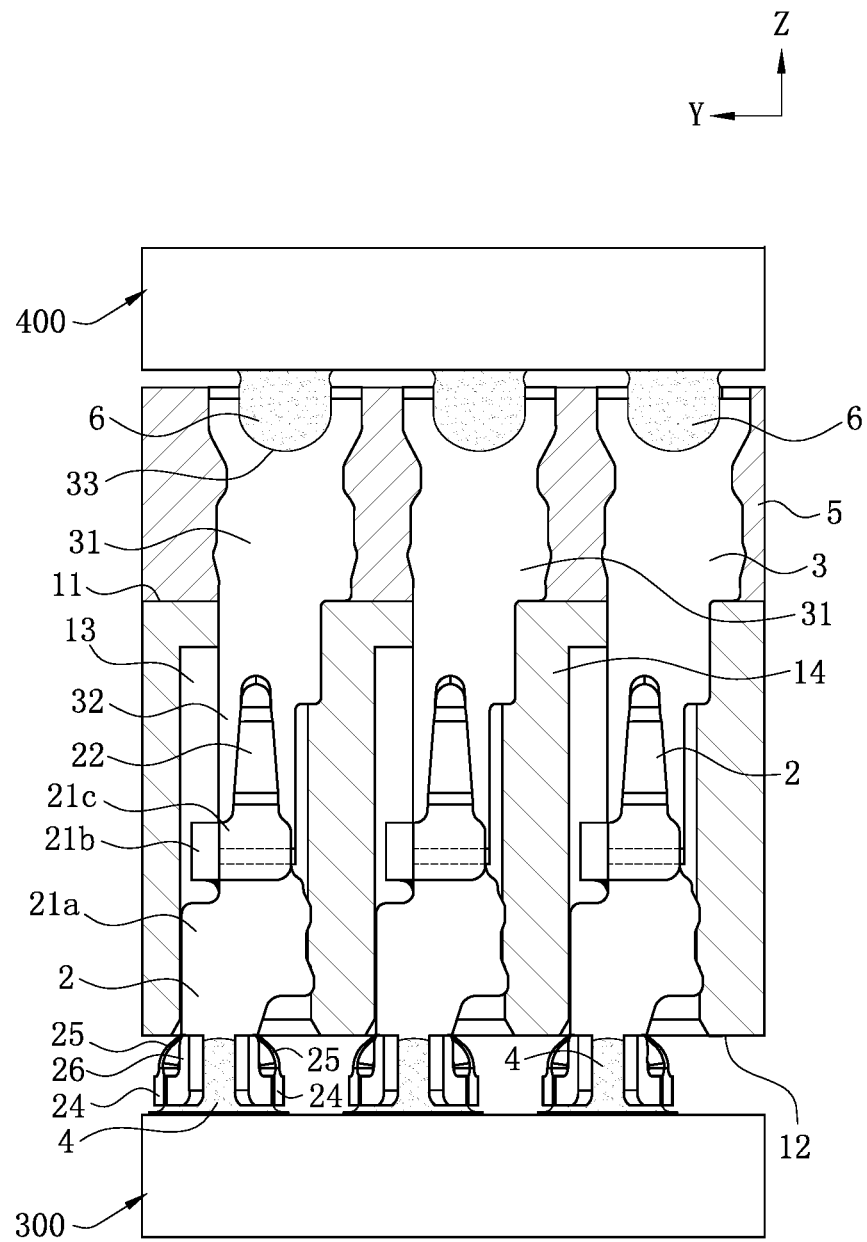
FIG. 21 is a schematic view of the socket and the corresponding plug in FIG. 20 after insertion.
Figure 22:
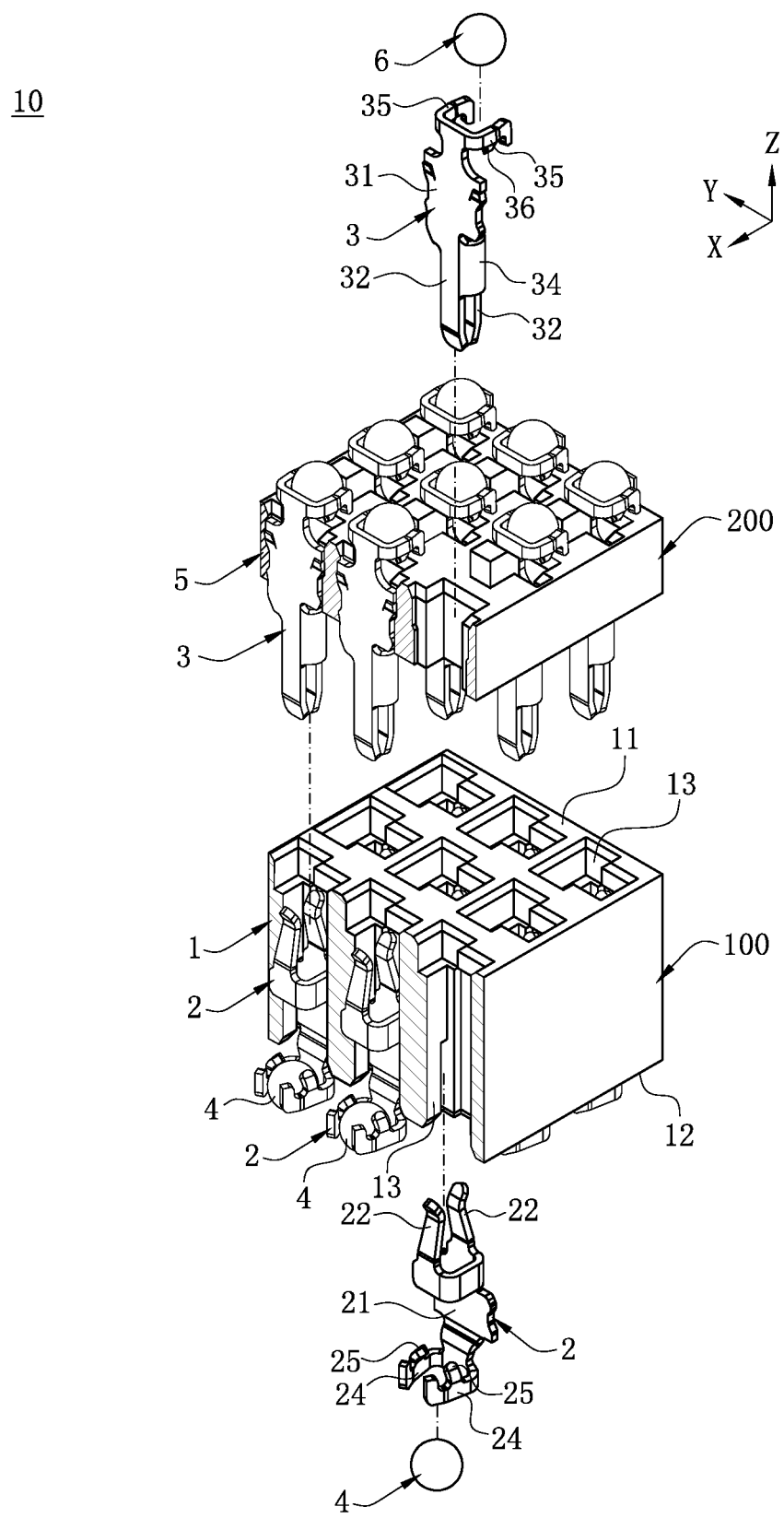
FIG. 22 is a perspective view of an electrical connector assembly according to a third embodiment of the present invention.
Figure 23:
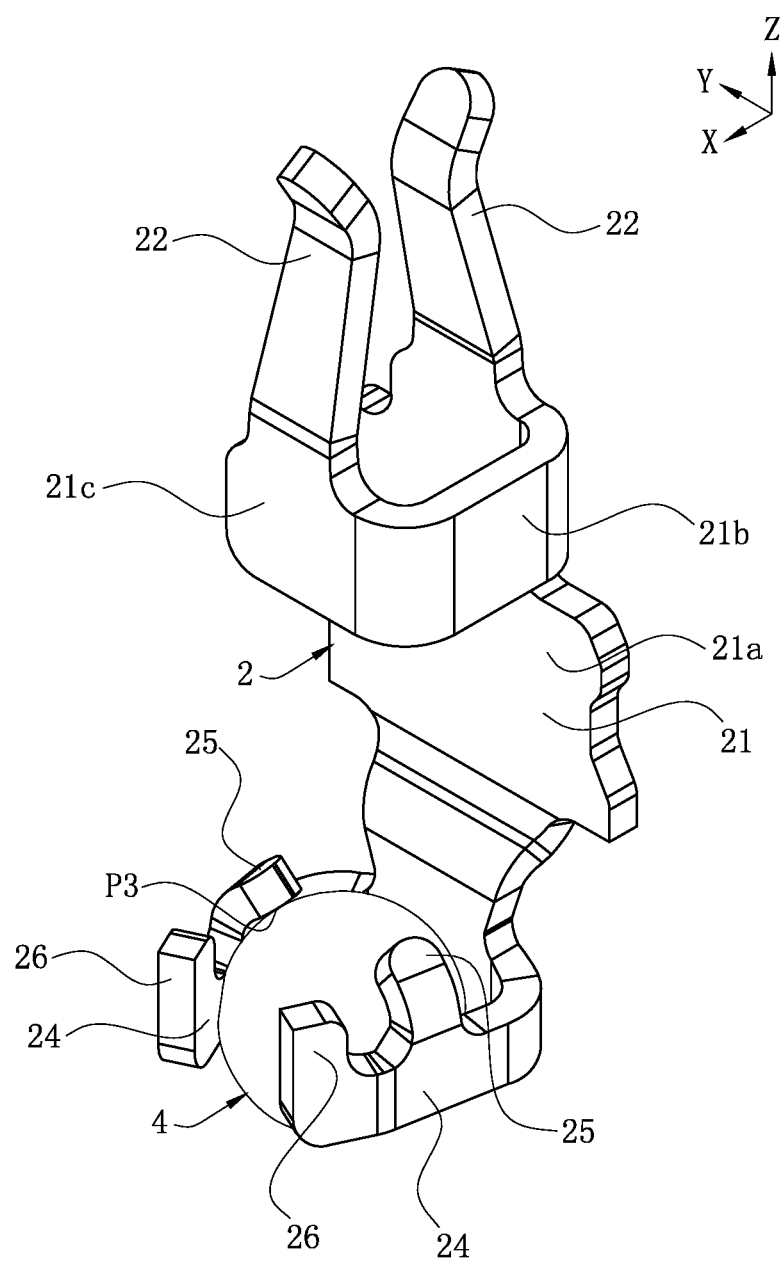
FIG. 23 is a perspective view of a terminal and a solder in FIG. 22 after being assembled.
Figure 24:
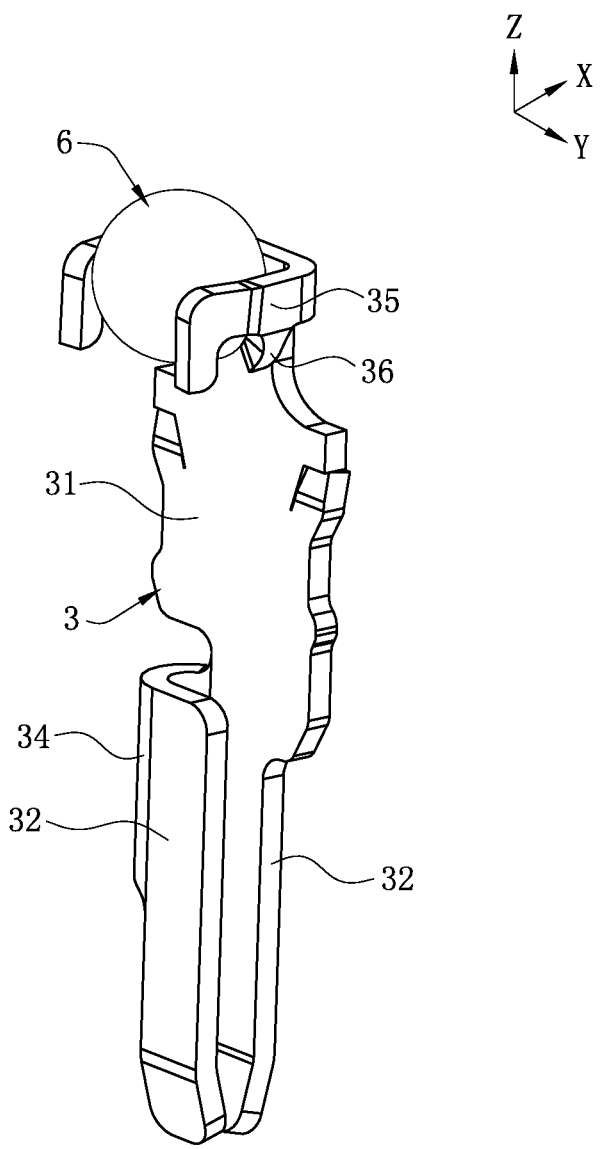
FIG. 24 is a perspective view in another angle of a pin and a solder ball in FIG. 22 after being assembled.
Figure 25:
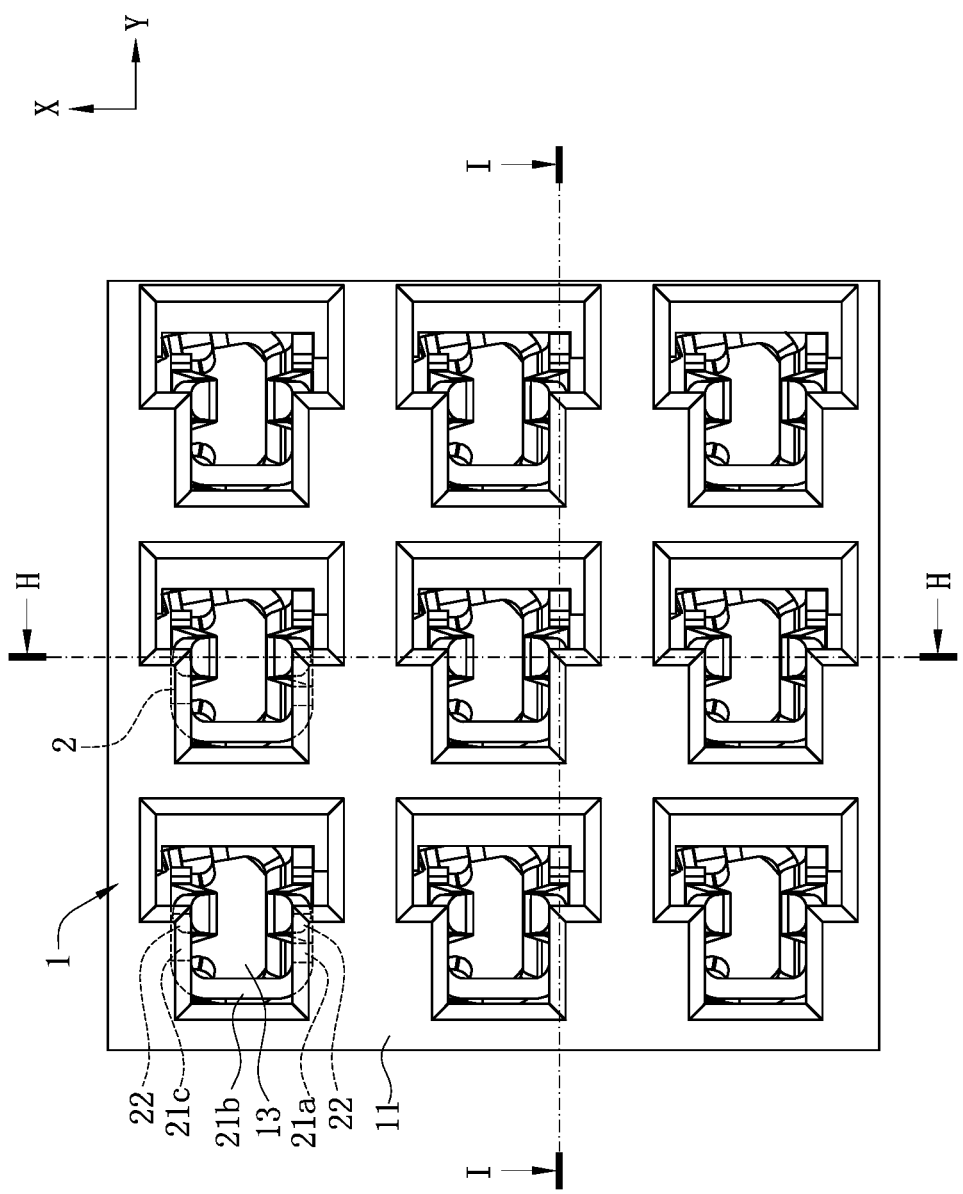
FIG. 25 is a top view of a socket in FIG. 22.
Figure 26:
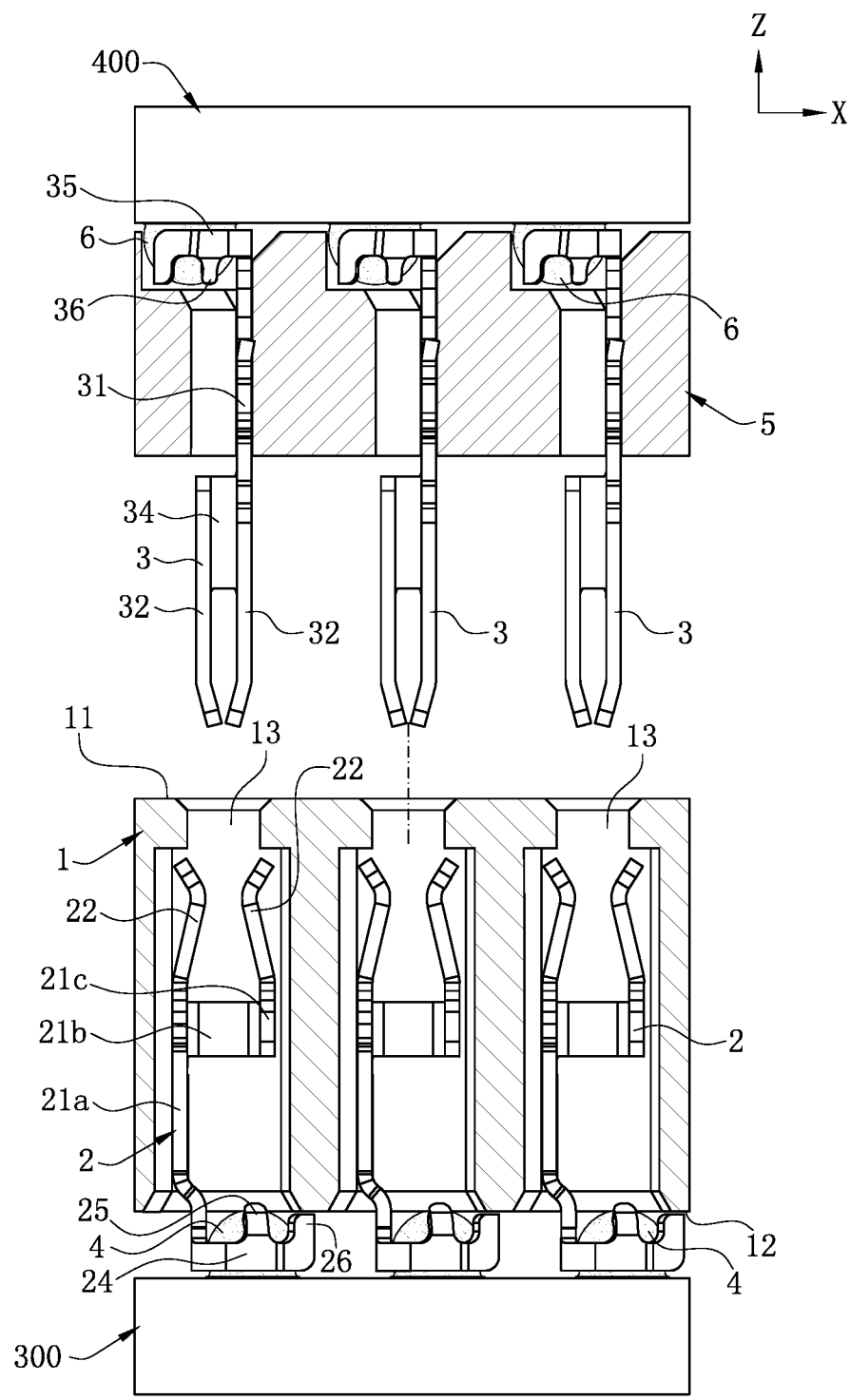
FIG. 26 is a sectional view of the socket in FIG. 25 and a corresponding plug before insertion along the H-H direction.
Figure 27:
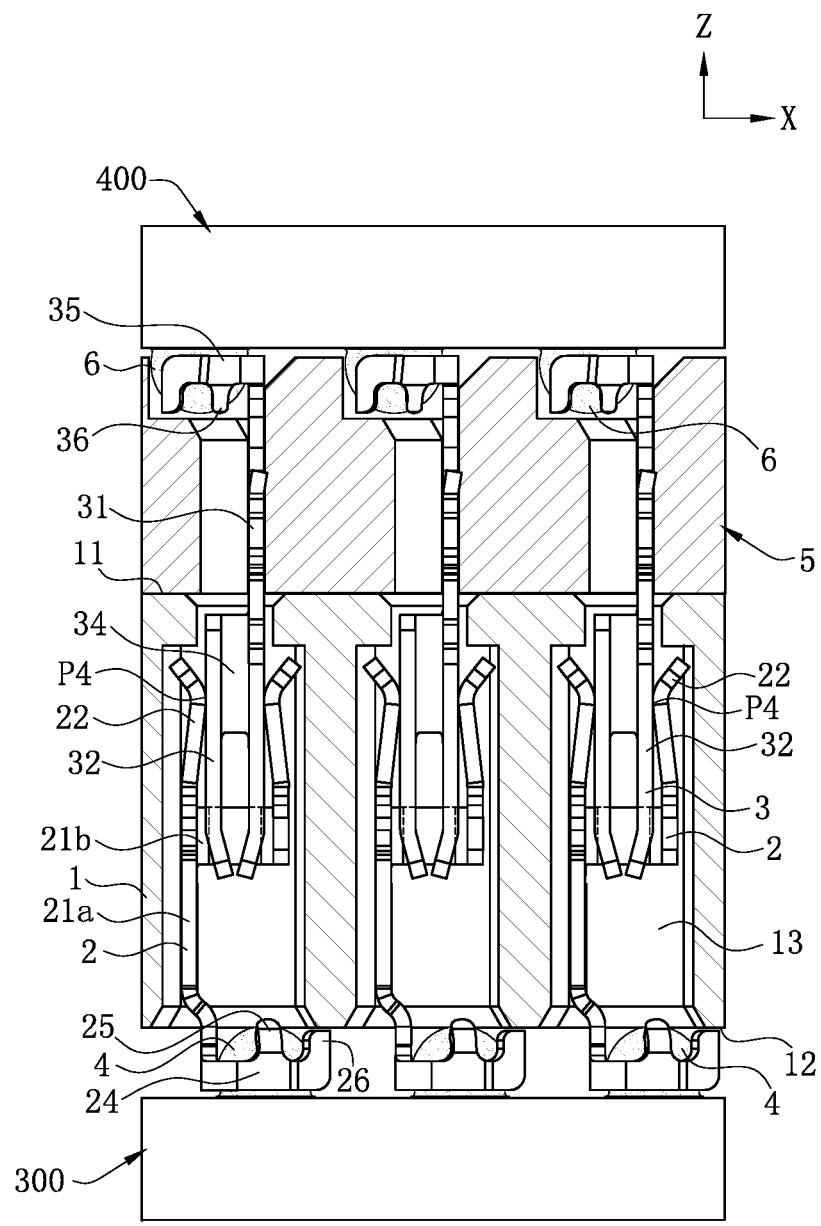
FIG. 27 is a schematic view of the socket and the corresponding plug in FIG. 26 after insertion.
Figure 28:
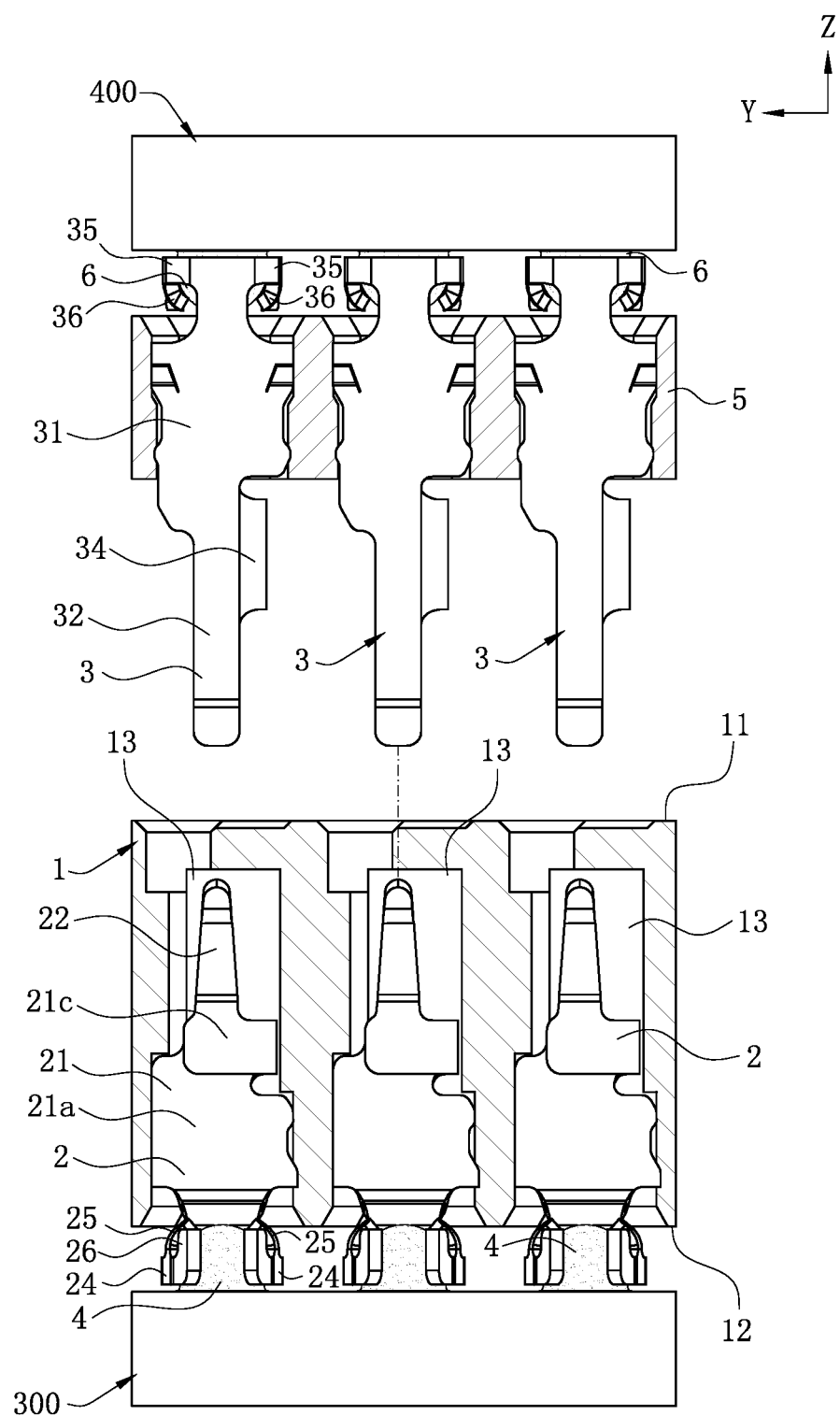
FIG. 28 is a sectional view of the socket in FIG. 25 and a corresponding plug before insertion along the I-I direction.
Figure 29:
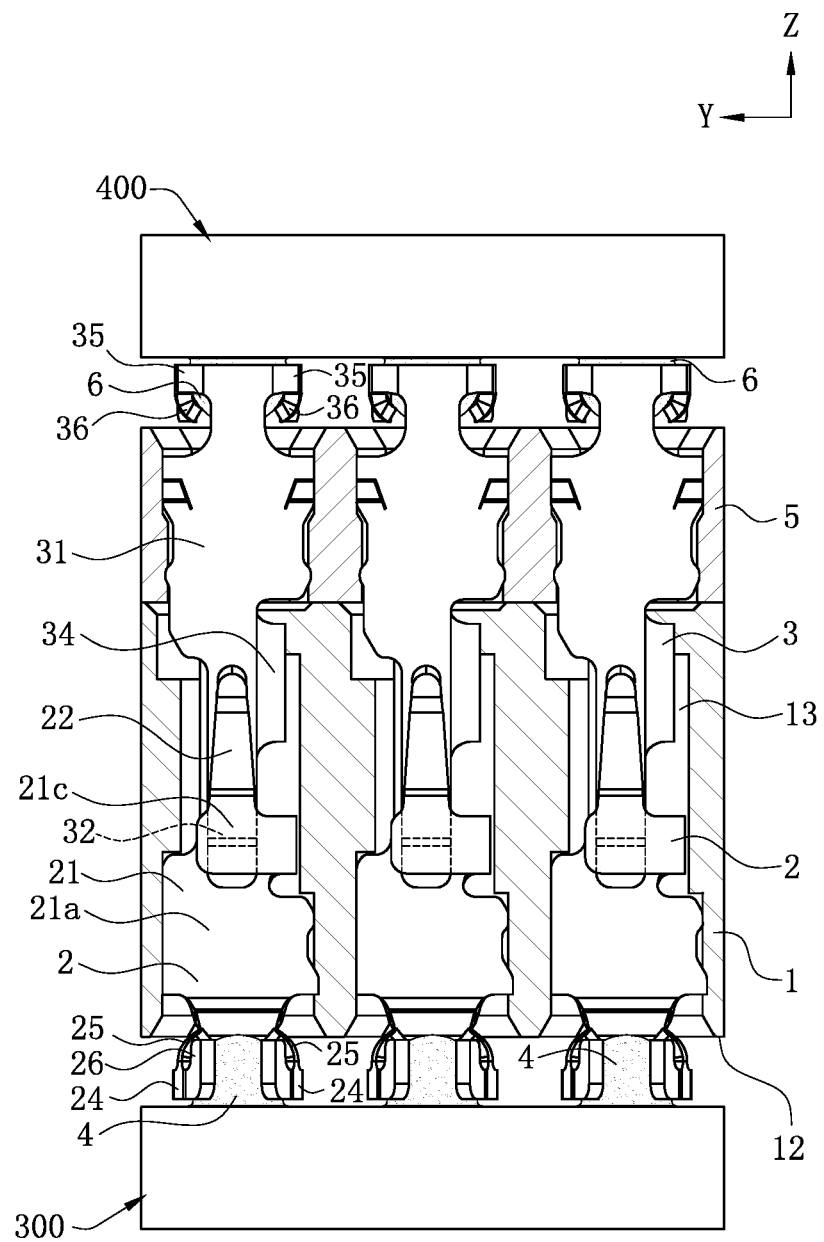
FIG. 29 is a schematic view of the socket and the corresponding plug in FIG. 28 after insertion.

As shown in FIG. 8 and FIG. 14, in this embodiment, a contact position P1 of the clamping portion 223 and the corresponding pin 3 is higher than a contact position P2 of the abutting portion 232 and the corresponding pin 3. In other embodiments, the contact position P1 of the clamping portion 223 and the corresponding pin 3 may alternatively be higher than the contact position P2 of the abutting portion 232 and the corresponding pin 3.

As shown in FIG. 2, FIG. 3 and FIG. 7, the two embracing arms 24 are formed by bending and extending forward from the left and right sides of a lower end of the base 21, and are configured to clamp a solder 4 to solder the terminal 2 to a circuit board 300. In this embodiment, the solder 4 is a solder ball. The two stopping portions 25 are formed by bending and extending upward from the two embracing arms 24 to be close to each other. An upper end of each of the two stopping portions 25 is higher than the lower end of each of the protruding portions 213. The two stopping portions 25 are located right above the solder 4 to limit the solder 4 from moving upward. In other embodiments, each terminal 2 may alternatively have only one stopping portion 25, which is provided on one of the embracing arms 24.

Figure 5:
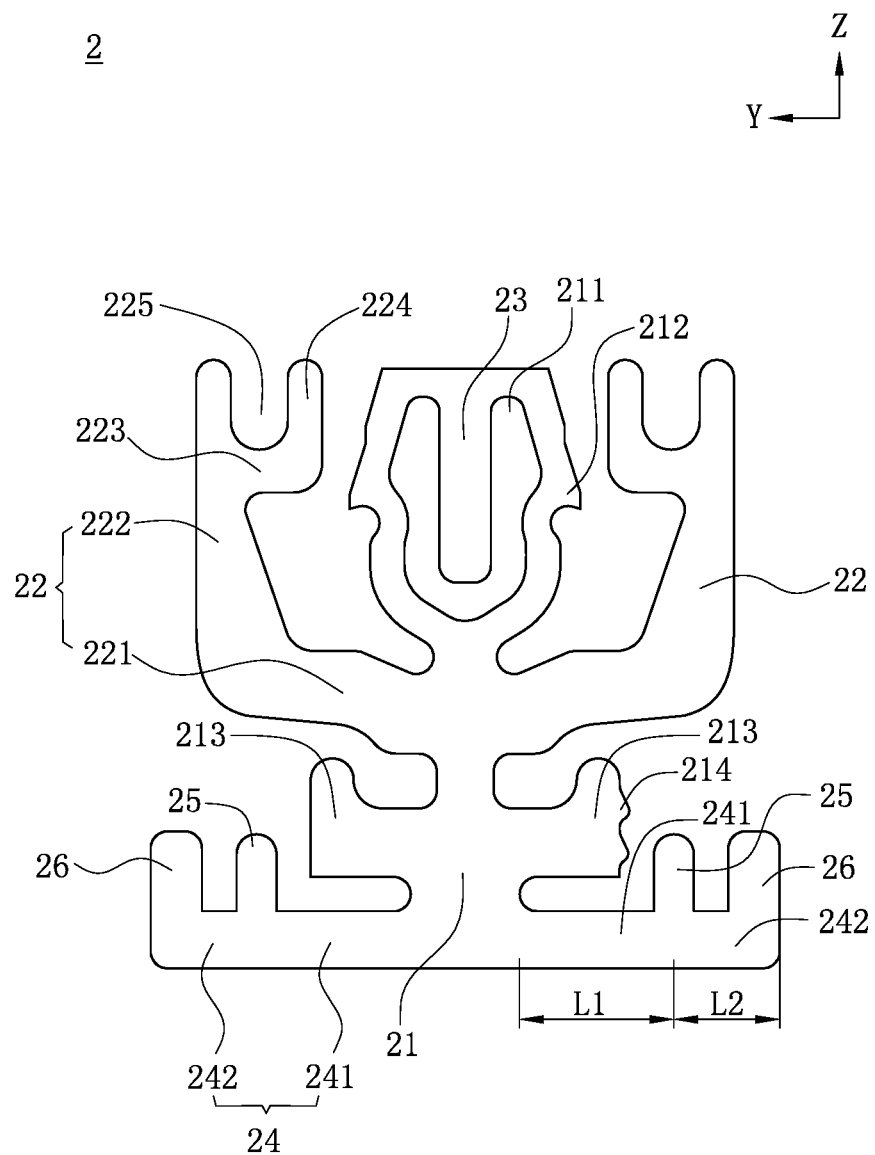
FIG. 5 is a plain unfolded view of the terminal in FIG. 2.

As shown in FIG. 2, FIG. 4 and FIG. 5, each embracing arm 24 includes a first section 241 connecting the base 21 and the corresponding stopping portion 25 and a second section 242 connecting a front end of the embracing arm 24 and the corresponding stopping portion 25, and a length L1 of the first section 241 is greater than a length L2 of the second section 242 (refer to FIG. 5).

As shown in FIG. 2, FIG. 3 and FIG. 7, in this embodiment, the two stopping portions 25 and the two embracing arms 24 jointly clamp the solder 4, and are located on a same side of the base 21 as the two clamping arms 22, and a contact position P3 of each stopping portion 25 and the solder 4 is lower than a highest point of the solder 4.

As shown in FIG. 2, FIG. 3 and FIG. 7, the two position stopping portions 26 are formed by vertically extending upward from the front ends of the two embracing arms 24. The two position stopping portions 26 are located in front of the two stopping portions 25, and an upper end of each of the two position stopping portions 26 is higher than the upper end of each of the two stopping portions 25. When the solder 4 is loaded upward between the two embracing arms 24, the two position stopping portions 26 match with the receiving holes 133 to prevent the two embracing arms 24 from excessively moving upward.

As shown in FIG. 1 and FIG. 9, when the socket 100 is assembled, the terminals 2 are first mounted into the receiving holes 133 upward from the bottom thereof, until the hook portions 212 are accommodated in the position limiting slots 135. Meanwhile, the protruding portions 213 match with the walls of the grooves 136 to fix the terminals 2 in the receiving holes 133. As shown in FIG. 6, FIG. 7 and FIG. 10, an upper end of the first guiding portion 224 and the upper end of the base 21 are both located right below the blocking wall 134, and the clamping portions 223 and the abutting portion 232 are located right below the connecting hole 132.

Figure 11:
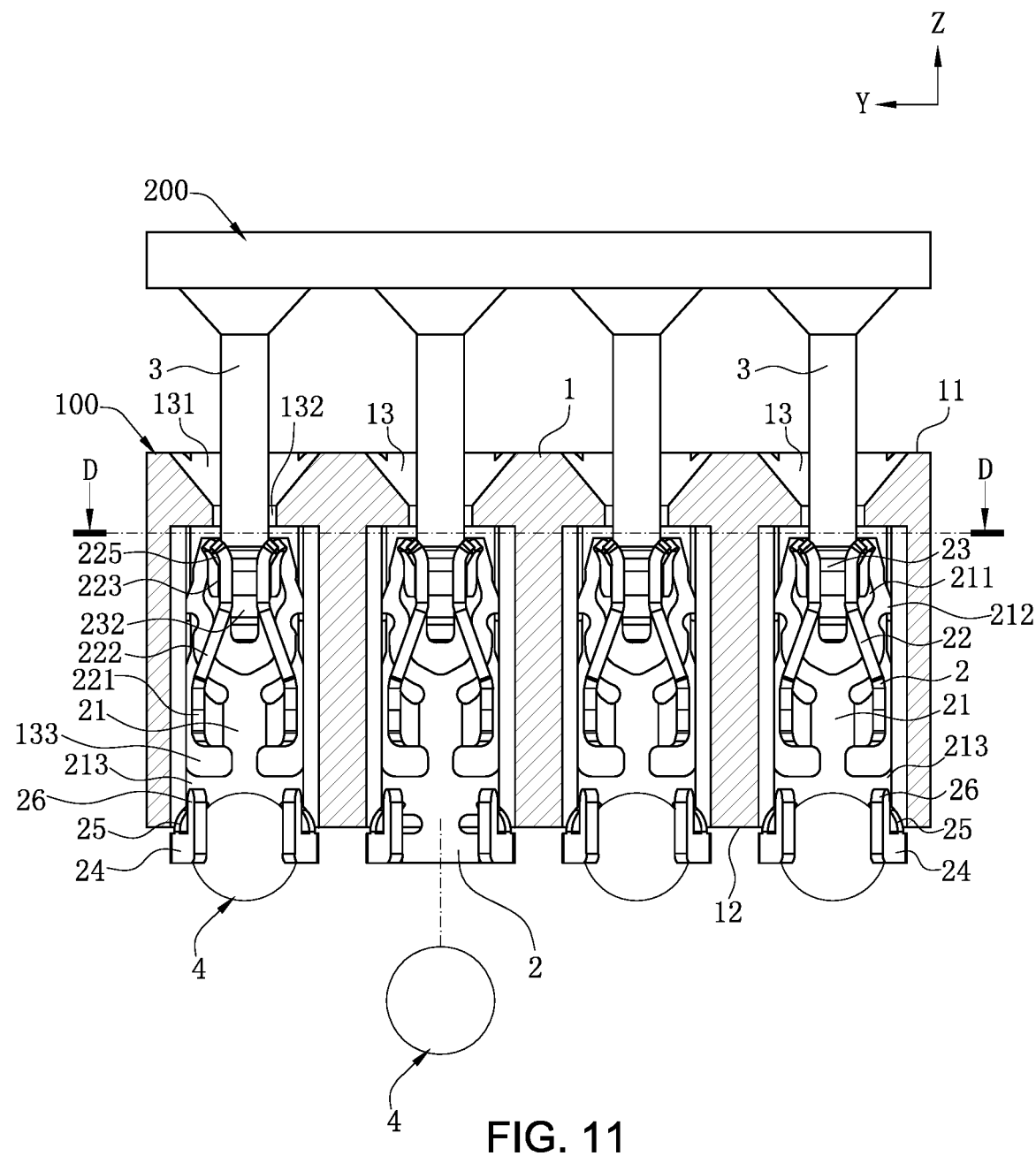
FIG. 11 is a sectional view of a terminal of the socket and a pin of the corresponding plug in FIG. 10 starting to contact each other.
Figure 12:
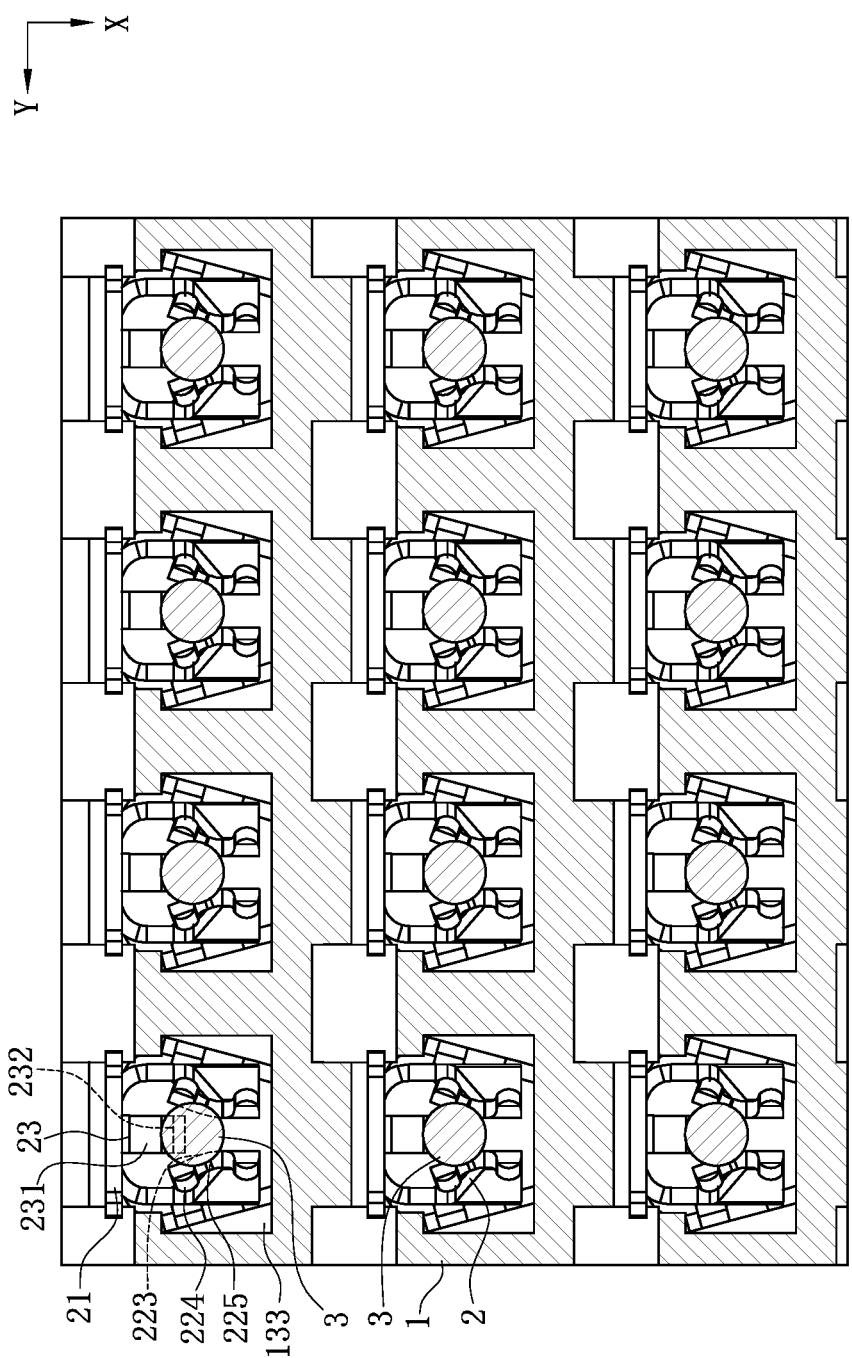
FIG. 12 is a sectional view of the socket and the corresponding plug in FIG. 11 along the D-D direction.
Figure 13:
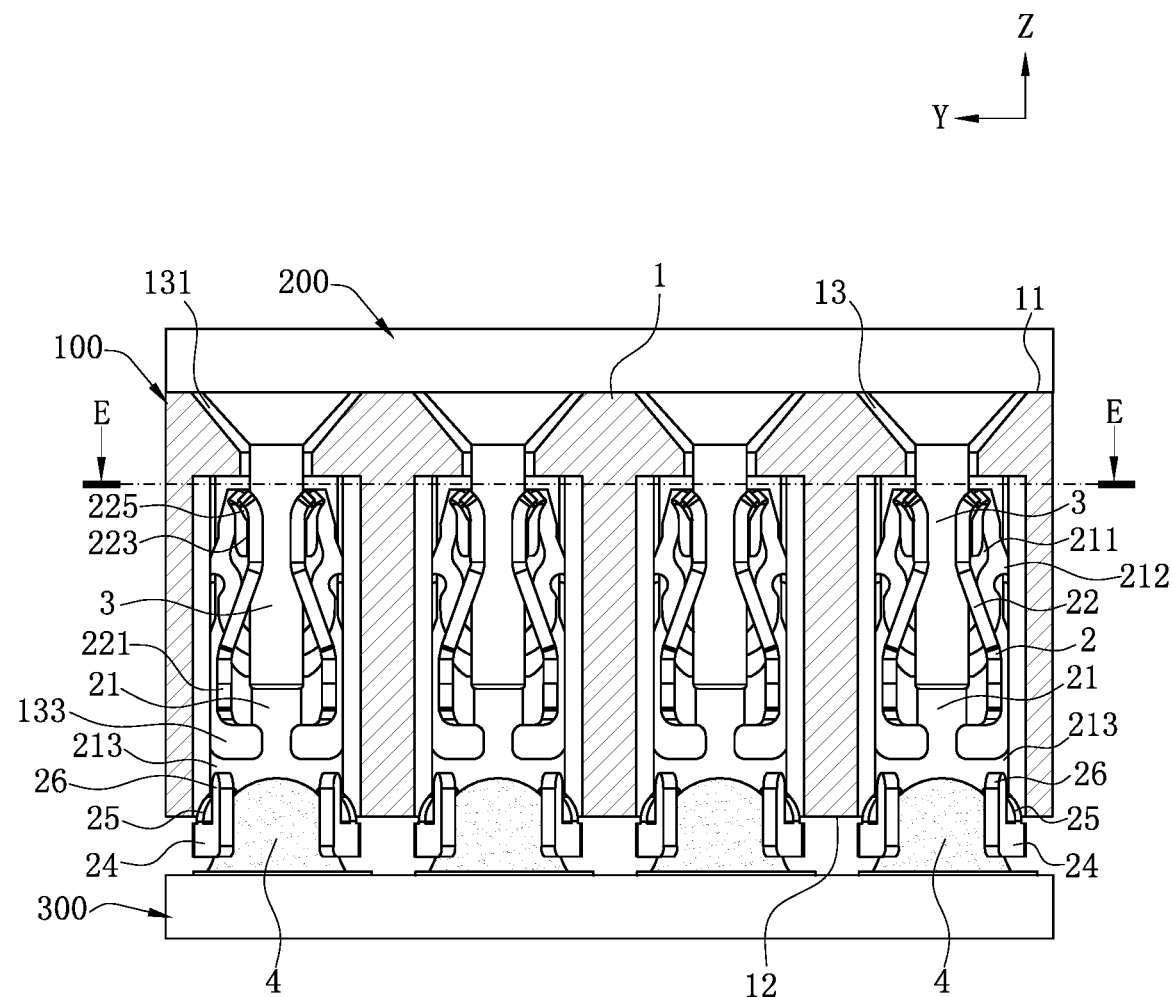
FIG. 13 is a schematic view of the socket and the corresponding plug in FIG. 10 after insertion.

As shown in FIG. 10, FIG. 11 and FIG. 13, when the socket 100 is used, the socket 100 is first mounted on the circuit board 300, and the socket 100 is fixed to the circuit board 300 through soldering by the solder 4. Then, the plug 200 is downward mounted to the socket 100. The corresponding pin 3 is successively inserted downward through the guiding hole 131 and the connecting hole 132 and into the corresponding receiving hole 133, and the two first guiding portions 224 and the second guiding portion 231 guide the corresponding pin 3 to move downward, such that the corresponding pin 3 is first clamped between the two clamping portions 223 and then abuts the abutting portion 232 (refer to FIG. 6 and FIG. 7), until the plug 200 downward abuts the insulation body 1 to electrically connect the plug 200 to the circuit board 300.

FIG. 15 to FIG. 21 show an electrical connector assembly 10 according to a second embodiment of the present invention. A main difference between the electrical connector assembly 10 in the second embodiment and the electrical connector assembly 10 in the first embodiment exists in that: the body 1 includes a plurality of separation walls 14, and each separation wall 14 is located between two adjacent accommodating holes 13. Each base 21 includes a fixing portion 21a fixed to the corresponding accommodating hole 13, a connecting portion 21b formed by bending and extending forward from a left side of the fixing portion 21a, and an extending portion 21c formed by bending and extending rightward from a front side of the connecting portion 21b. One of the two clamping arms 22 is formed by extending upward from the fixing portion 21a, and the other of the two clamping arms 22 is formed by extending upward from the extending portion 21c. The plug 200 includes a base seat 5, and the pins 3 are fixed in the base seat 5 and extend downward out of the base seat 5. In other embodiments, the pins 3 may alternatively be attached to a bottom surface of the base seat 5. Further, each pin 3 is in a plate shape, and the plate surface of each pin 3 is parallel to a plate surface of the fixing portion 21a. Each pin 3 includes a plate portion 31 fixed in the base seat 5, a conducting arm 32 extending downward from the plate portion 31 and extending out of the base seat 5, and a recess 33 formed by downward concavely provided on an upper end of the plate portion 31. The recess 33 accommodates a solder ball 6 to solder the plug 200 to a substrate 400. When the conducting arm 32 is inserted downward into a corresponding accommodating hole 13 to a final position, the two clamping arms 22 jointly clamp the conducting arm 32, a height of a lower end of the conducting arm 32 is between an upper end and a lower end of the connecting portion 21b, and the plate portion 31 is partially located right above the separation wall 14.

FIG. 22 to FIG. 29 show an electrical connector assembly 10 according to a third embodiment of the present invention. A main difference between the electrical connector assembly 10 in the third embodiment and the electrical connector assembly 10 in the second embodiment exists in that: the connecting portion 21b is formed by bending and extending from a right side of the fixing portion 21a, and the extending portion 21c is formed by bending and extending leftward from a front side of the connecting portion 21b. Each pin 3 includes two conducting arms 32 opposite to each other, and a connection arm 34 connecting the two conducting arms 32. One of the two conducting arms 32 extends downward from the plate portion 31, an upper end of each of the two conducting arms 32 is located below the base seat 5, and lower ends of the two conducting arms 32 bend and extend downward toward each other. When the two conducting arms 32 are inserted downward into the accommodating holes 13 to a final position, the two clamping arms 22 jointly clamp the two conducting arms 32, a height of the contact position P4 of each of the two clamping arms 22 and each of the two conducting arms 32 is between the upper end and the lower end of the connecting arm 34, and the lower ends of the two conducting arms 32 are lower than the lower end of the connecting portion 21b. Each pin 3 further includes two clamping portion 35 formed by bending and extending backward from left and right sides of the upper end of the plate portion 31, and two position limiting portions 36 formed by bending and extending downward toward each other from the two clamping portions 35. The two position limiting portions 36 are located below the solder ball 6 and are configured to limit the solder ball 6 from moving downward. The two clamping portions 35 and the two position limiting portions 36 jointly clamp the solder ball 6 to solder the pin 3 to the substrate 400. In other embodiments, each pin 3 may alternatively have only one position limiting portion 36, which is provided on one of the clamping portions 35.

To sum up, the electrical connector and the electrical connector assembly according to certain embodiments of the present invention have the following beneficial effects:

(1) The embracing arms 24 clamp the solder 4, and the stopping portions 25 extend from the embracing arms 24 to stop the solder 4 from moving upward, such that the solder 4 can be well positioned. When the solder 4 is soldered and melted, the embracing arms 24 drive the stopping portions 25 to shrink, such that the embracing arms 24 and the stopping portions 25 jointly squeeze the solder 4, damaging an oxidation layer on a surface of the solder 4 to a greater extent, and enhancing a soldering effect of the solder 4.

(2) The embracing arms 24 and the stopping portions 25 jointly clamp the solder 4, such that the solder 4 can be further clamped and positioned, further ensuring a soldering effect of the solder 4.

(3) The first section 241 connects the base 21 and the corresponding stopping portion 25, the second sections 242 connects the front end of the embracing arm 24 and the corresponding stopping portion 25, and the length of the first section 241 is greater than the length of the second section 242, such that the corresponding stopping portion 25 is provided at a position with relatively good elasticity on the embracing arm 24. When the solder 4 is soldered and melted, squeezing the solder 4 by the stopping portions 25 can be further enhanced.

(4) The upper ends of the two stopping portions 25 are higher than the lower ends of the protruding portions 213, ensuring lengths of the stopping portions 25, thus enhancing the elasticity of the stopping portions 25.

(5) The clamping portions 35 clamp the solder ball 6, and the position limiting portions 36 extend from the clamping portions 35 to stop the solder ball 6 from moving downward, such that the solder ball 6 can be well positioned. When the solder ball 6 is soldered and melted, the clamping portions 35 drive the position limiting portions 36 to shrink, such that the clamping portions 35 and the position limiting portions 36 jointly squeeze the solder ball 6, damaging an oxidation layer on a surface of the solder ball 6 to a greater extent, and enhancing a soldering effect of the solder ball 6.

(6) The clamping portions 35 and the position limiting portions 36 jointly clamp the solder ball 6, such that the solder ball 6 can be further clamped and positioned, further ensuring a soldering effect of the solder ball 6.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
   a body; and
   a plurality of terminals, correspondingly provided on the body, wherein each of the terminals comprises a base, two embracing arms formed by bending and extending forward from two opposite sides of the base, and a stopping portion formed by extending upward from one of the embracing arms, the two embracing arms jointly clamp a solder to solder the terminal to a circuit board, and the stopping portion is located above the solder to stop the solder from moving upward,
   wherein a position stopping portion is formed by extending upward from the one of the embracing arms to match with the body to limit the one of the embracing arms from moving upward, and the stopping portion is located behind the position stopping portion.

2. The electrical connector according to claim 1, wherein the two embracing arms and the stopping portion jointly clamp the solder, and a contact position of the stopping portion and the solder is lower than a highest point of the solder.

3. The electrical connector according to claim 1, wherein two stopping portions are respectively provided on the two embracing arms, and the two stopping portions bend and extend upward toward each other.

4. The electrical connector according to claim 1, wherein the position stopping portion vertically extends upward from a front end of the one of the embracing arms, and an upper end of the position stopping portion is higher than an upper end of the stopping portion.

5. The electrical connector according to claim 1, wherein two protruding portions are formed by extending from a left side and a right side of the base to fix and match with the body, and an upper end of the stopping portion is higher than a lower end of each of the protruding portions.

6. An electrical connector, comprising:
   a body; and
   a plurality of terminals, correspondingly provided on the body, wherein each of the terminals comprises a base, two embracing arms formed by bending and extending forward from two opposite sides of the base, and a stopping portion formed by extending upward from one of the embracing arms, the two embracing arms jointly clamp a solder to solder the terminal to a circuit board, and the stopping portion is located above the solder to stop the solder from moving upward,
   wherein each of the embracing arms comprises a first section connecting the base and the stopping portion and a second section connecting a front end of the embracing arm and the stopping portion, and a length of the first section is greater than a length of the second section.

7. The electrical connector according to claim 6, wherein the base of each of the terminals comprises a fixing portion fixed to the body, a connecting portion formed by bending and extending from a side of the fixing portion, and an extending portion formed by bending and extending from a side of the connecting portion, each of the terminals comprises two clamping arms configured to jointly clamp a pin of a plug, one of the two clamping arms is formed by extending upward from the fixing portion, and the other of the two clamping arms is formed by extending upward from the extending portion.

8. The electrical connector according to claim 6, wherein each of the terminals comprises two extending arms formed by extending forward and upward from two opposite sides of the base, two elastic arms formed by extending upward from upper ends of the two extending arms, two clamping portions formed by extending backward from rear sides of the two elastic arms, and two guiding portions formed by extending upward from the two clamping portions, the two guiding portions are configured to guide a pin of a plug to be inserted downward, and the two clamping portions are configured to jointly clamp the pin.

9. The electrical connector according to claim 6, wherein the two embracing arms and the stopping portion jointly clamp the solder, and a contact position of the stopping portion and the solder is lower than a highest point of the solder.

10. The electrical connector according to claim 6, wherein two stopping portions are respectively provided on the two embracing arms, and the two stopping portions bend and extend upward toward each other.

11. The electrical connector according to claim 6, wherein two protruding portions are formed by extending from a left side and a right side of the base to fix and match with the body, and an upper end of the stopping portion is higher than a lower end of each of the protruding portions.

12. An electrical connector assembly, comprising:
    a plug, comprising a base seat and a plurality of pins positioned on the base seat and extends downward out of the base seat, wherein each of the pins comprises two clamping portions and a position limiting portion formed by bending and extending downward from one of the clamping portions, the two clamping portions clamp a solder ball to solder a corresponding one of the pins to a substrate, and the position limiting portion is located below the solder ball to stop the solder ball from moving downward; and
    a socket, comprising:
        a body, and
        a plurality of terminals provided on the body, wherein each of the terminals comprises a base provided on the body, two clamping arms and two embracing arms formed by extending from the base, and a stopping portion formed by extending upward from one of the embracing arms, the two clamping arms jointly clamp a corresponding pin of the pins, the two embracing arms jointly clamp a solder to solder the terminal to a circuit board, and the stopping portion is located above the solder to stop the solder from moving upward.

13. The electrical connector assembly according to claim 12, wherein two stopping portions are respectively provided on the two embracing arms, and the two stopping portions bend and extend upward toward each other.

14. The electrical connector assembly according to claim 13, wherein the two embracing arms and the two stopping portions jointly clamp the solder.

15. The electrical connector assembly according to claim 12, wherein the base of each of the terminals comprises a fixing portion fixed to the body, a connecting portion formed by bending and extending from a side of the fixing portion, and an extending portion formed by bending and extending from a side of the connecting portion, one of the two clamping arms is formed by extending upward from the fixing portion, and the other of the two clamping arms is formed by extending upward from the extending portion.

16. The electrical connector assembly according to claim 15, wherein each of the pins comprises a plate portion, two conducting arms opposite to each other, and a connecting arm that connects the two conducting arms, one of the two conducting arms is formed by extending downward from the plate portion, the two conducting arms extend downward out of the base seat and are inserted into the body, and when the two conducting arms are inserted downward into the body to a final position, the two clamping arms jointly clamp the two conducting arms, and a height of a contact position of the two clamping arms and the two conducting arms is between an upper end and a lower end of the connecting arm.

17. The electrical connector assembly according to claim 16, wherein lower ends of the two conducting arms bend and extend downward toward each other, and when the two conducting arms are inserted downward into the body to the final position, the lower ends of the two conducting arms are lower than a lower end of the connecting portion.

18. The electrical connector assembly according to claim 15, wherein each of the pins is in a plate shape, and a plate surface of each of the pins is parallel to a plate surface of the fixing portion of a corresponding one of the terminals.

19. The electrical connector assembly according to claim 12, wherein the body has a plurality of accommodating holes accommodating the terminals and a separation wall located between two adjacent ones of the accommodating holes, and each of the pins is in a plate shape and is partially located right above the separation wall.

20. The electrical connector assembly according to claim 12, wherein two position limiting portions are respectively provided on the two clamping portions, and the two clamping portions and the two position limiting portions jointly clamp the solder ball.

\* \* \* \* \*